(12) United States Patent
Tsai

(10) Patent No.: US 12,314,032 B2
(45) Date of Patent: May 27, 2025

(54) METHOD FOR CONTROLLING DEPOSITION TOOL

(71) Applicant: NANYA TECHNOLOGY CORPORATION, New Taipei (TW)

(72) Inventor: Tzu-Ching Tsai, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 539 days.

(21) Appl. No.: 17/735,303

(22) Filed: May 3, 2022

(65) Prior Publication Data

US 2023/0359168 A1 Nov. 9, 2023

(51) Int. Cl.
G05B 19/40 (2006.01)
G05B 19/4099 (2006.01)
H01L 21/67 (2006.01)
H01L 21/66 (2006.01)

(52) U.S. Cl.
CPC .......... *G05B 19/4099* (2013.01); *G05B 2219/45031* (2013.01); *H01L 21/67* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 5,849,136 A | 12/1998 | Mintz et al. | |
| 6,410,351 B1 * | 6/2002 | Bode | H01L 22/20 257/E21.525 |
| 6,969,672 B1 | 11/2005 | Hewett et al. | |
| 7,477,960 B2 * | 1/2009 | Willis | G05B 19/4184 700/121 |
| 7,524,683 B2 * | 4/2009 | Rathei | G05B 23/0232 438/14 |
| 7,539,585 B2 * | 5/2009 | Baseman | G05B 19/41875 700/32 |

(Continued)

FOREIGN PATENT DOCUMENTS

| | | | | |
|---|---|---|---|---|
| CN | 101089758 A | * | 12/2007 | ............. G05B 19/04 |
| GB | 2499816 A | * | 9/2013 | ......... B81C 1/00349 |

(Continued)

OTHER PUBLICATIONS

Mozumder et al., "A Monitor Wafer Based Controller for Semiconductor Processes", Feb. 1994, IEEE Transactions on Semiconductor Manufacturing, vol. 7, No. 3, Aug. 1994. (Year: 1994).*

(Continued)

*Primary Examiner* — Mohammad Ali
*Assistant Examiner* — Kelvin Booker
(74) *Attorney, Agent, or Firm* — Xuan Zhang

(57) ABSTRACT

The present application discloses a method for controlling a deposition tool. The method includes executing a first deposition recipe on a current wafer; generating a first set of data of the current wafer by a first measurement module; analyzing the first set of data by an artificial intelligence module coupled to the first measurement module; generating, by the artificial intelligence module, a second deposition recipe and applying the second deposition recipe to the deposition tool when the first set of data is not within a predetermined range; and executing the second deposition recipe on a next wafer.

9 Claims, 19 Drawing Sheets

(56) References Cited

U.S. PATENT DOCUMENTS

| | | | | |
|---|---|---|---|---|
| 7,650,251 | B2* | 1/2010 | Baseman | G05B 19/41875 700/32 |
| 8,615,314 | B1* | 12/2013 | Sonderman | G05B 19/41875 700/44 |
| 9,002,492 | B2* | 4/2015 | Moyne | G06N 5/04 700/104 |
| 9,102,033 | B2* | 8/2015 | Hui | B24B 49/02 |
| 9,886,009 | B2* | 2/2018 | Moyne | G05B 13/026 |
| 10,185,312 | B2* | 1/2019 | Fischer | G05B 19/41875 |
| 10,475,712 | B2* | 11/2019 | Levy | G01B 9/02021 |
| 11,177,183 | B2* | 11/2021 | Liu | H01L 22/12 |
| 11,520,321 | B2* | 12/2022 | Pandev | G06F 30/367 |
| 2006/0184264 | A1* | 8/2006 | Willis | G05B 19/4184 700/110 |
| 2007/0020782 | A1* | 1/2007 | Rathei | H01L 22/20 257/E21.525 |
| 2007/0293968 | A1* | 12/2007 | Fu | G05B 19/41875 700/121 |
| 2008/0312858 | A1* | 12/2008 | Baseman | G05B 19/41875 702/83 |
| 2012/0129431 | A1* | 5/2012 | Hui | B24B 37/005 451/5 |
| 2014/0080304 | A1* | 3/2014 | Zhang | H01L 21/67219 257/E21.295 |
| 2018/0061691 | A1* | 3/2018 | Jain | H01L 22/12 |
| 2018/0096906 | A1* | 4/2018 | Levy | C23C 14/547 |
| 2018/0188717 | A1* | 7/2018 | Chen | G05B 19/0426 |
| 2018/0217584 | A1* | 8/2018 | Fischer | G05B 19/41875 |
| 2020/0091013 | A1* | 3/2020 | Liu | H01L 22/12 |
| 2021/0165398 | A1* | 6/2021 | Pandev | G05B 19/41875 |

FOREIGN PATENT DOCUMENTS

| | | |
|---|---|---|
| IN | 114065687 A | 2/2022 |
| TW | I753166 B | 1/2022 |
| TW | 202211342 A | 3/2022 |

OTHER PUBLICATIONS

Chia-Yen et al., "Data science framework for variable selection, metrology prediction, and process control in TFT-LCD manufacturing", Feb. 2018, Robotics and Computer Integrated Manufacturing 55 (2019) 76-87. (Year: 2018).*

Kuo, R.J., "Multi-sensor integration for on-line tool wear estimation through artificial neural networks and fuzzy neural network", Mar. 1999, Engineering Applications of Arti® cial Intelligence 13 (2000) 249-261. (Year: 1999).*

Kearney et al., "Creating new multistep etch and deposition processes with recycled etch data using SandBox Studio AI™", 2022, Proc. of SPIE vol. 12056 120560E-1. (Year: 2022).*

Henn-Lecordier et al., "Real-time sensing and metrology for atomic layer deposition processes and manufacturing", Jan. 2007, J. Vac. Sci. Technol. B 25,,1 . . . , Jan./Feb. 2007. (Year: 2007).*

Du et al., "Intelligent Turning Tool Monitoring with Neural Network Adaptive Learning", Jan. 2019, Hindawi Complexity, vol. 2019, Article ID 8431784, 21 pages. (Year: 2019).*

Nadi et al., "Use of Influence Diagrams and Neural Networks in Modeling Semiconductor Manufacturing Processes", Dec. 1989, IEEE Transactions on Semiconductor Manufacturing, vol. 4, No. I , Feb. 1991. (Year: 1989).*

Orlowski, M., "Challenges for Process Modeling and Simulation in the 90's—an Industrial Perspective", Sep. 1991, Simulation of Semiconductor Devices and Processes vol. 4. (Year: 1991).*

Limanond et al., "Monitoring and Control of Semiconductor Manufacturing Processes", Dec. 1998, IEEE Control Systems. (Year: 1998).*

Kankalale, D. P., "Smart Scheduler Design for Wafer Processing Systems", Dec. 2019, The Faculty of the Department of Computer Engineering, San Jose State University. (Year: 2019).*

Choi et al., "Machine learning-based virtual metrology on film thickness in amorphous carbon layer deposition process", Mar. 2021, Measurement: Sensors 16 (2021) 100046. (Year: 2021).*

Chou et al., "Integrating support vector machine and genetic algorithm to implement dynamic wafer quality prediction system", 2009, Expert Systems with Applications 37 (2010) 4413-4424. (Year: 2009).*

Office Action mailed on May 25, 2023 related to Taiwanese Application No. 111122903.

Office Action mailed on Feb. 3, 2023 related to Taiwanese Application No. 111122903.

* cited by examiner

METHOD FOR CONTROLLING DEPOSITION TOOL

TECHNICAL FIELD

The present disclosure relates to a method for controlling a deposition tool, and more particularly, to a method for controlling the deposition tool with an artificial intelligence module.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for controlling an etching tool, including: executing a first etching recipe on a current wafer; generating a first set of data of the current wafer by a first measurement module; analyzing the first set of data by an artificial intelligence module coupled to the first measurement module; generating, by the artificial intelligence module, a second etching recipe and applying the second etching recipe to the etching tool when the first set of data is not within a predetermined range; and executing the second etching recipe on a next wafer.

Another aspect of the present disclosure provides a method for controlling an etching tool, including: executing a first etching recipe on a current wafer; generating a first set of data of the current wafer by a first measurement module; analyzing the first set of data by an artificial intelligence module coupled to the first measurement module; and executing the first etching recipe on a next wafer when the first set of data is within a predetermined range.

Another aspect of the present disclosure provides a method for controlling an etching tool, including: executing an etching recipe on a current wafer, wherein the etching recipe includes at least a first stage and a second stage; generating a first set of data of the current wafer by monitoring the first stage of the etching recipe using a first measurement module; analyzing the first set of data by an artificial intelligence module coupled to the first measurement module; and adjusting, by the artificial intelligence module, the second stage of the etching recipe when the first set of data is not within a predetermined range. The second stage of the etching process is executed after the first stage of the etching recipe.

Another aspect of the present disclosure provides a method for controlling an etching tool, including: executing an etching recipe on a current wafer, wherein the etching recipe includes at least a first stage and a second stage; generating a first set of data of the current wafer by monitoring the first stage of the etching recipe using a first measurement module; analyzing the first set of data by an artificial intelligence module coupled to the first measurement module; and executing the second stage of the etching recipe when the first set of data is within a predetermined range.

Another aspect of the present disclosure provides a method for controlling a deposition tool, including: executing a first deposition recipe on a current wafer; generating a first set of data of the current wafer by a first measurement module; analyzing the first set of data by an artificial intelligence module coupled to the first measurement module; generating, by the artificial intelligence module, a second deposition recipe and applying the second deposition recipe to the deposition tool when the first set of data is not within a predetermined range; and executing the second deposition recipe on a next wafer.

Another aspect of the present disclosure provides a method for controlling a deposition tool, including: executing a first deposition recipe on a current wafer; generating a first set of data of the current wafer by a first measurement module; analyzing the first set of data by an artificial intelligence module coupled to the first measurement module; executing the first deposition recipe on a next wafer when the first set of data is within a predetermined range.

Another aspect of the present disclosure provides a method for controlling an implantation tool, including: executing a first implantation recipe on a current wafer; generating a first set of data of the current wafer by a first measurement module; analyzing the first set of data by an artificial intelligence module coupled to the first measurement module; generating, by the artificial intelligence module, a second implantation recipe and applying the second implantation recipe to the implantation tool when the first set of data is not within a predetermined range; and executing the second implantation recipe on a next wafer.

Another aspect of the present disclosure provides a method for controlling an implantation tool, including: executing a first implantation recipe on a current wafer; generating a first set of data of the current wafer by a first measurement module; analyzing the first set of data by an artificial intelligence module coupled to the first measurement module; and executing the first implantation recipe on a next wafer when the first set of data is within a predetermined range.

Due to the design of the method for controlling the process tool of the present disclosure, the related process recipe may be updated (or adjust) on a wafer-to-wafer time frame by employing the artificial intelligence module and the feedback data measured by the first measurement module. As a result, the yield and/or reliability of the wafers may be improved The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
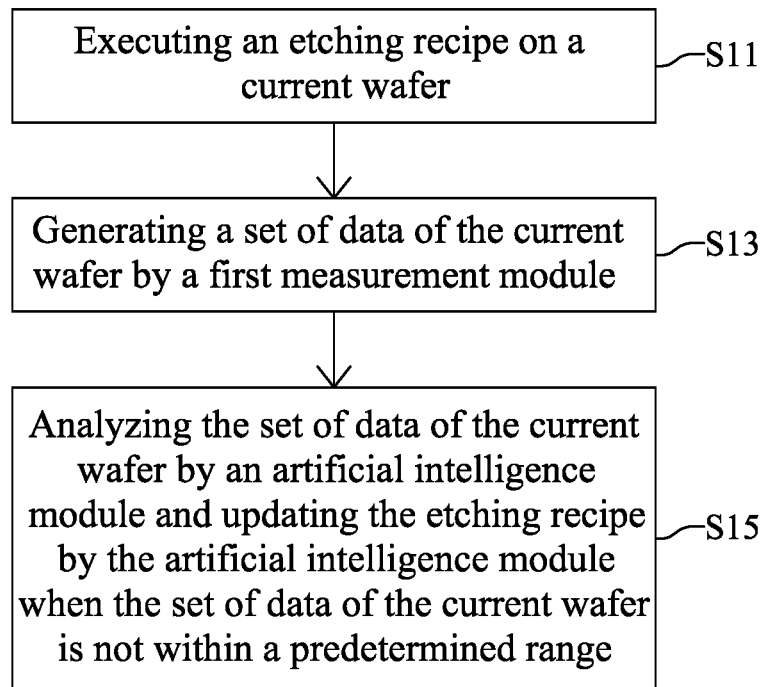
FIG. 1 illustrates, in a flowchart diagram form, a method for controlling an etching process system in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

Figure 2:
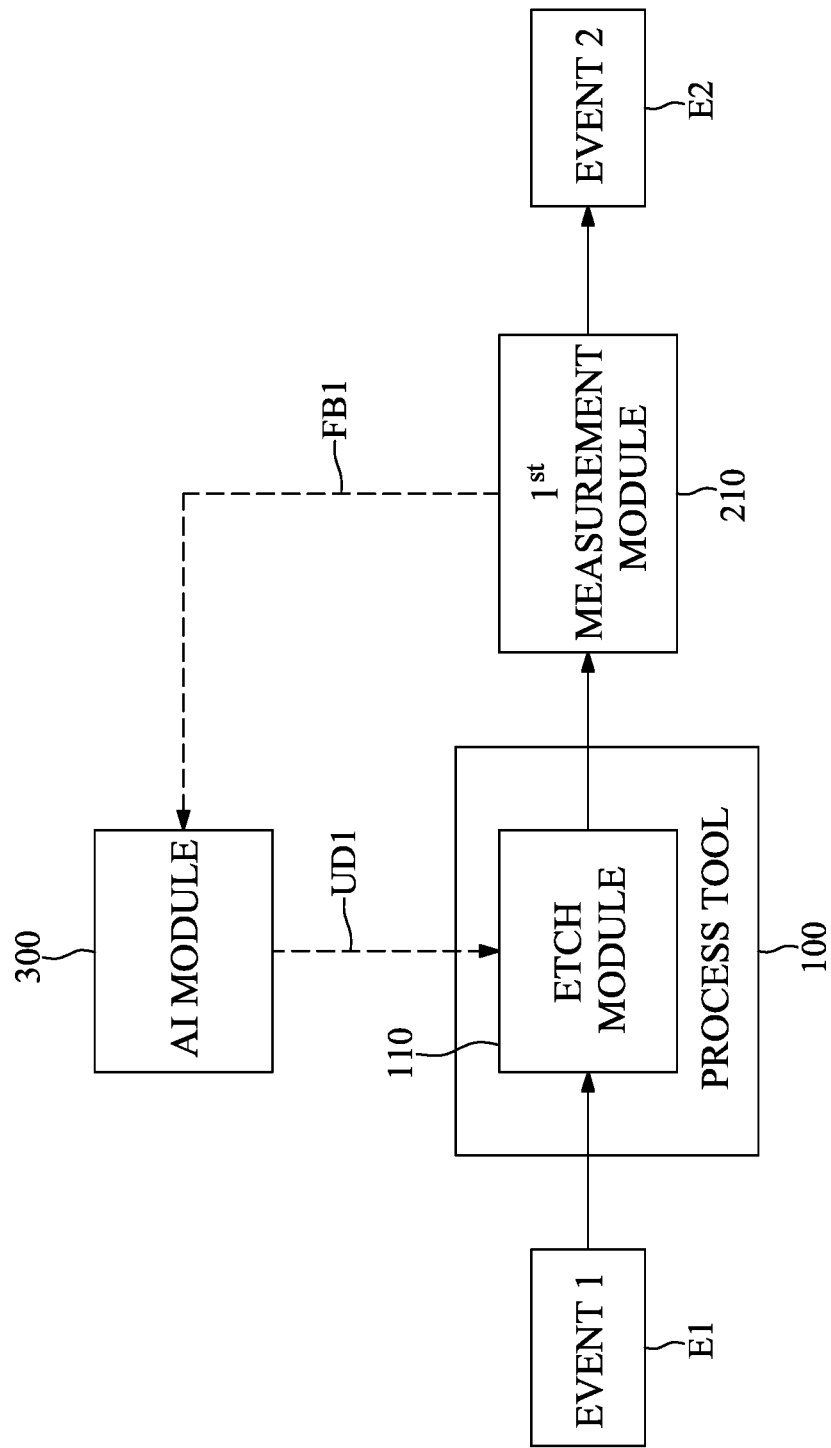
FIG. 2 illustrates an exemplary block diagram of the etching process system in accordance with one embodiment of the present disclosure.

FIG. 1 illustrates, in a flowchart diagram form, a method 10 for controlling an etching process system in accordance with one embodiment of the present disclosure. FIG. 2 illustrates an exemplary block diagram of the etching process system in accordance with one embodiment of the present disclosure.

With reference to FIGS. 1 and 2, at step S11, an etching recipe may be executed on a current wafer.

With reference to FIG. 2, the diagram may include a material process flow, illustrated as solid lines, and an information flow, illustrated as dashed lines. The material process flow may include part of the process for etching a semiconductor substrate, such as, for example, a wafer.

In some embodiments, the first event E1 may be a wafer-in event to transfer the current wafer into the process tool 100 which provides means for changing the current wafer from a first state to a second state.

It should be noted that, in the first event E1, multiple wafers may be likely to be processed grouped in lots, as such, the reference to a wafer in the singular in the present embodiment does not by necessity limit the disclosure to a single wafer, but may be illustrative of a lot including a plurality of wafers, a plurality of lots, or any such grouping of material.

In some embodiments, the process tool 100 may include, for example, at least one of an etch module, a deposition module, a polishing module, a lithography module, a trimming module, and/or a thermal treatment module. In the present embodiment, the process tool 100 may include the etch module 110. That is, in the present embodiment, the material process flow may include an etching process for the current wafer. In some embodiments, the current wafer may include a patterned photoresist layer or a patterned hard mask layer on the top before being processed by the etch module 110.

In some embodiments, the etch module 110 may include one or more etching chambers that are not separately illustrated. The current wafer may be placed in the etching chamber, and then may be subjected to the etching process employing the etching recipe. The etching recipe for the current wafer may also be referred to as the first etching recipe). In some embodiments, the first etching recipe may be a nominal recipe.

In some embodiments, the process tool 100 may include a graphic user interface (GUI) component (not shown for clarity) and a database (not shown for clarity). The GUI component may be provided that enable users to: view tool status and process module status; create and edit x-y charts of summary and raw (trace) parametric data for selected wafers; view tool alarm logs; configure data collection plans that specify conditions for writing data to the database or to output files; input files to statistical process control (SPC) charting, modeling and spreadsheet programs; examine wafer processing information for specific wafers, and review data that is currently being saved to the database; create and edit SPC charts of process parameters, and set SPC alarms which generate email warnings; run multivariate principal component analysis (PCA) and/or partial least squares (PLS) models; and/or view diagnostics screens in order to troubleshoot and report problems with the process tool 100.

In some embodiments, raw data and trace data from the process tool 100 may be stored as files in the database. The amount of data may depend on the data collection plans configured by the user, as well as the frequency with which processes are performed and which processing modules are run. The data obtained from the process tool 100 may be stored in tables. In some embodiments, the GUI component of the process tool 100 and the database of the process tool 100 may not be required.

In some embodiments, the artificial intelligence module 300 may be coupled to the process tool 100 or, detailedly, to the etch module 110 of the process tool 100. In some embodiments, the artificial intelligence (AI) module 300 and the process tool 100 may be independent elements which physically separate from each other. The communication between the artificial intelligence module 300 and the process tool 100 may use any suitable communication technologies, such as analog technologies (e.g., relay logic), digital technologies (e.g., RS232, Ethernet, or wireless), network technologies (e.g., local area network (LAN), a wide area network (WAN), the Internet), Bluetooth technologies, Near-field communication technologies, and/or any other suitable communication technologies. The communication between the artificial intelligence module 300 and the process tool 100 may be compliant with the general equipment module/semiconductor equipment communications standard (GEM SECS) communications protocol.

In some embodiments, the artificial intelligence module 300 may be integrated in the process tool 100.

In some embodiments, the artificial intelligence module 300 may be coupled to the first measurement module 210. In some embodiments, the artificial intelligence module 300 and the first measurement module 210 may be independent elements which physically separate from each other. The communication between the artificial intelligence module 300 and the first measurement module 210 may use any suitable communication technologies, such as analog technologies (e.g., relay logic), digital technologies (e.g., RS232, Ethernet, or wireless), network technologies (e.g., local area network, a wide area network, the Internet), Bluetooth technologies, Near-field communication technologies, and/or any other suitable communication technologies. The communication between the artificial intelligence module 300 and the first measurement module 210 may be compliant with the general equipment module/semiconductor equipment communications standard communications protocol.

In some embodiments, the artificial intelligence module 300 may operate as a single input single output (SISO) device, as a single input multiple output (SIMO) device, as a multiple input single output (MISO) device, and as a multiple input multiple output (MIMO) device.

In some embodiments, the artificial intelligence module 300 may include any suitable hardware (which can execute software or application in some embodiments), such as, for example, computers, microprocessors, microcontrollers, application specific integrated circuits (ASICs), field-programmable gate arrays (FGPAs), and digital signal processors (DSPs) (any of which can be referred to as a hardware processor), encoders, circuitry to read encoders, memory devices (including one or more EPROMS, one or more EEPROMs, dynamic random access memory ("DRAM"), static random access memory ("SRAM"), and/or flash memory), and/or any other suitable hardware elements.

In the artificial intelligence module 300 may include a GUI component (not shown for clarity) and a database (not shown for clarity). The GUI component of the artificial intelligence module 300 may provide means of interaction between the artificial intelligence module 300 and a user. Authorized users and administrators may use the GUI component to modify the configuration and default parameters of the artificial intelligence module 300. Configuration data may be stored in the database.

In some embodiments, the GUI component of the artificial intelligence module 300 may include a status component for displaying the current status for the artificial intelligence module 300. In addition, the status component may include a charting component for presenting system-related and process-related data to a user using one or more different types of charts.

In some embodiments, the database of the artificial intelligence module 300 may be used for archiving input and output data. For example, the artificial intelligence module 300 may archive received inputs, sent outputs, and actions taken by the artificial intelligence module 300 in a searchable database.

In some embodiments, the artificial intelligence module 300 may include means for data backup and restoration. Also, the searchable database can include model information, configuration information, and historical information and the artificial intelligence module 300 may use the database component to backup and restore model information and model configuration information both historical and current.

Icial intelligence module 300 may include a number of applications including at least one tool-related application, at least one module-related application, at least one sensor-related application, at least one interface-related application, at least one database-related application, at least one GUI-related application, and/or at least one configuration application.

In some embodiments, the artificial intelligence module 300 may include algorithms including one or more of the following, alone or in combination: machine learning, hidden Markov models; recurrent neural networks; convolutional neural networks; Bayesian symbolic methods; general adversarial networks; support vector machines; and/or any other suitable artificial intelligence algorithm.

In some embodiments, the artificial intelligence module 300 may include at least one process model which can predict a second state of the current wafer. For example, a process model for etch rate may be used along with a processing time to compute an etch depth, and a process model for deposition rate may be used along with a processing time to compute a deposition thickness. In some embodiments, the process model may include SPC charts, PLS models, PCA models, fault detection/correction (FDC) models, and multivariate analysis (MVA) models. In some embodiments, the artificial intelligence module 300 may receive and utilize externally provided data for process parameter limits in the process tool 100. For example, the GUI component of the artificial intelligence module 300 may provide a means for the manual input of the process parameter limits.

In some embodiments, artificial intelligence module 300 may be used to configure any number of process tools having any number of process modules associated with them and independent process modules. The artificial intelligence module 300 may collect, provide, process, store, and display data from processes involving process tools, process modules, and/or sensors.

With reference to FIG. 2, after the etching process of the etch module 110 using the first etching recipe, the wafer state of the current wafer may be turned into the second state (after the etching process) from the first state (before the etching process) by the etch module 110 of the process tool 100.

With reference to FIGS. 1 and 2, at step S13, a set of data of the current wafer may be generated by a first measurement module 210.

Then, the current processed wafer may be transferred to the first measurement module 210. The first measurement module 210 may collect data of the second state of the current processed wafer. In some embodiments, the first measurement module 210 may include a single measurement device or multiple measurement devices. The first measurement module 210 may include process module related measurement devices, tool-related measurement devices, and/or external measurement devices.

In some embodiments, the first measurement module 210 may be an after-etching-inspection (AEI) metrology tool. The AEI metrology tool may inspect and check for defects, contamination, and critical dimension (CD) following the etching process. In some embodiments, the first measurement module 210 may include an optical spectrum (e.g., optical critical dimension or OCD) metrology tool to measure CD and/or profiles of etched features. The following uses CD as an example.

With reference to FIGS. 1 and 2, at step S15, the set of data of the current wafer may be analyzed by the artificial intelligence module 300 and the etching recipe may be updated by the artificial intelligence module when the set of data of the current wafer is not within a predetermined range.

With reference to FIG. 2, in some embodiments, the CD of the current processed wafer collected by the first measurement module 210 after the etching process may be analyzed by the artificial intelligence module 300 to determine that the CD is within a predetermined range. If the CD is not within the predetermined range, the data (as shown in dashed arrow FB1) of current processed wafer collected by the first measurement module 210 may be fed back to the artificial intelligence module 300 which coupled to the process tool 100 or, detailedly, to the etch module 110 of the process tool 100. The artificial intelligence module 300 may update the first etching recipe according to the feedback CD data to provide a second etching recipe for the next wafer (as shown in dashed arrow UD1).

In some embodiments, the artificial intelligence module 300 may use the CD of the current processed wafer collected by the first measurement module 210 after the etching process to compute a set of process deviations. This computed set of process deviations may be determined based on the target CD and the CD of the current processed wafer collected by the first measurement module 210 after the etching process. The set of process deviations may be used to determine a correction to the first etching recipe for the next wafer to be processed. In the description of the present disclosure, a target CD indicates the desired critical dimension after the process is completed.

In some embodiments, the artificial intelligence module 300 may use table-based and/or formula-based techniques. For example, the recipes may be in a table, and the artificial intelligence module 300 does a table lookup to determine which correction or corrections provide the best solutions. Alternately, the corrections may be determined using a set of formulas, and the artificial intelligence module 300 determines which correction formula or corrections formulas provide the best solutions.

When the artificial intelligence module 300 uses table-based techniques, the feedback control variables are configurable. For example, a variable can be a constant or coefficient in the table. In addition, there can be multiple tables, and rule-based switching can be accomplished based on an input range or an output range.

When the artificial intelligence module 300 uses formula-based control, the feedback control variables are configurable. For example, a variable can be a constant or coefficient in the formula. In addition, there can be multiple formula combinations, and rule-based switching can be accomplished based on an input range or an output range.

With reference to FIG. 2, the second event E2 may represent a following process for the current process wafer. In the present embodiment, the second event E2 may be a clean process, a deposition process, or other applicable processes.

By employing the artificial intelligence module 300 coupled with the process tool 100, the related process recipe (e.g., the etching recipe in the present embodiment) may be updated (or adjusted) on a wafer-to-wafer time frame. As a result, the yield and/or reliability of the wafers may be improved.

Figure 3:
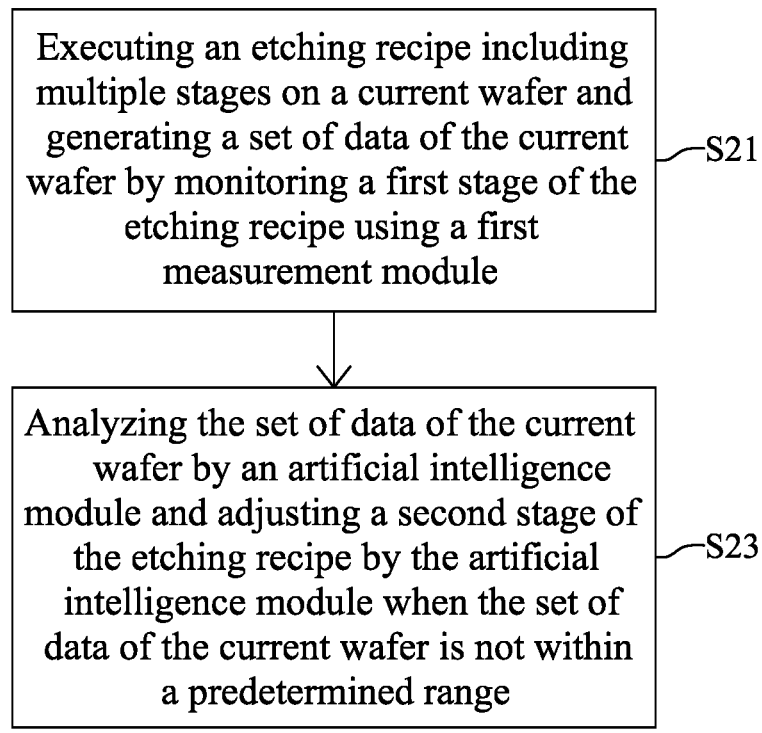
FIG. 3 illustrates, in a flowchart diagram form, a method for controlling an etching process system in accordance with another embodiment of the present disclosure.
Figure 4:
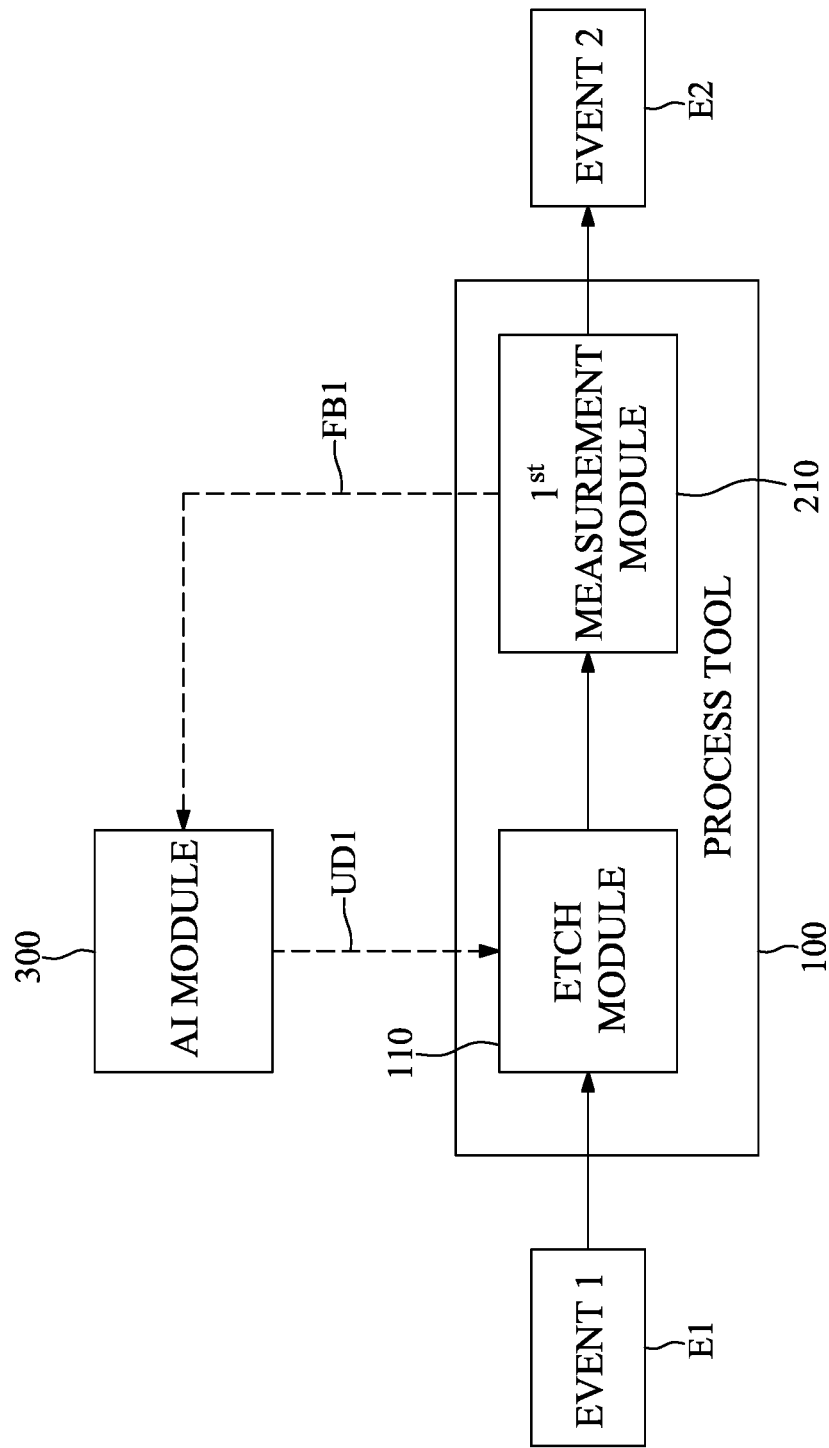
FIG. 4 illustrates an exemplary block diagram of the etching process system in accordance with another embodiment of the present disclosure.

FIG. 3 illustrates, in a flowchart diagram form, a method 20 for controlling an etching process system in accordance with another embodiment of the present disclosure. FIG. 4 illustrates an exemplary block diagram of the etching process system in accordance with another embodiment of the present disclosure.

With reference to FIGS. 3 and 4, at step S21, an etching recipe including multiple stages may be executed on a current wafer and a set of data of a current wafer may be generated by monitoring a first stage of the etching recipe using a first measurement module 210.

With reference to FIG. 4, the block diagram may illustrate an etching process system similar to that illustrated in FIG. 2. The same or similar elements in FIG. 4 as in FIG. 2 have been marked with similar reference numbers and duplicative descriptions have been omitted.

With reference to FIG. 4, the first measurement module 210 may be integrated within the process tool 100. In some embodiments, the first measurement module 210 may be a set of sensors which can monitor process-related parameters such as gas flow, gas ratio, or other applicable process-related parameters.

With reference to FIG. 4, the first measurement module 210 may provide feedback data to the artificial intelligence module 300 in a real time manner. Accordingly, the artificial intelligence module 300 may update the etching recipe immediately. For example, the first etching recipe may be a multi-stage recipe such as a two-stage recipe. The first measurement module 210 may continuously monitor process-related parameters during the first stage of the first etching recipe and feed back to the artificial intelligence module 300 (as shown in dashed arrow FB1).

With reference to FIGS. 3 and 4, at step S23, the set of data of the current wafer may be analyzed by the artificial intelligence module 300 and a second stage of the etching recipe may be adjusted by the artificial intelligence module when the set of data of the current wafer is not within a predetermined range.

With reference to FIG. 4, meanwhile, the artificial intelligence module 300 may analyze the feedback data to determine whether to update the second stage of the first etching recipe or not. If the first stage of the first etching recipe includes a process deviation, the artificial intelligence module 300 can make correction and update (as shown in dashed arrow UD1) the second stage of the first etching process to make the processed wafer have parameters (e.g., the CD) within the accepted criteria.

Accordingly, the first measurement module 210 may also continuously monitor process-related parameters during and after the second stage of the first etching process and feed back to the artificial intelligence module 300. Meanwhile, the artificial intelligence module 300 may analyze the feedback data to determine whether to update the first etching recipe for the next wafer to be processed.

FIGS. 5 to 9 illustrate exemplary block diagrams of etching process systems in accordance with some embodiments of the present disclosure.

Figure 5:
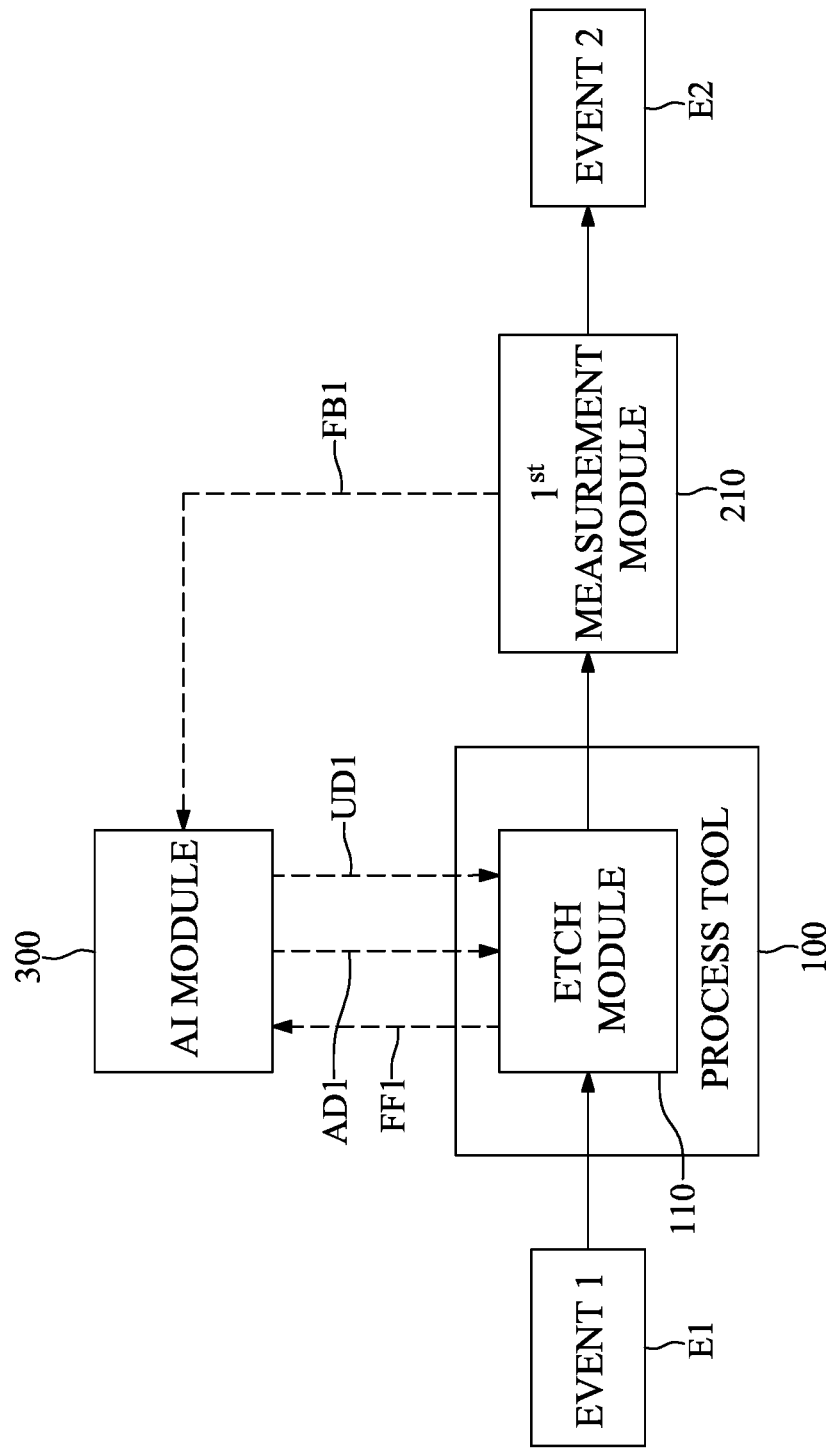
FIGS. 5 to 9 illustrate exemplary block diagrams of etching process systems in accordance with some embodiments of the present disclosure.

With reference to FIG. 5, the block diagram may illustrate an etching process system similar to that illustrated in FIG. 2. The same or similar elements in FIG. 5 as in FIG. 2 have been marked with similar reference numbers and duplicative descriptions have been omitted.

With reference to FIG. 5, before the process tool 100 including the etch module 110 processes the current wafer of the first event E1, the trace data of the process tool 100 such as tool trace data, maintenance data, end point detection (EPD) data, and/or other process-related data may be fed forward to the artificial intelligence module 300 (as shown in dashed arrow FF1). The artificial intelligence module 300 may analyze the trace data of the process tool 100 to adjust the etching recipe for processing the current wafer (as shown in dashed arrow AD1). After the process is completed, the artificial intelligence module 300 may also update the adjusted etching recipe according to the feedback data of the first measurement module 210.

Figure 6:
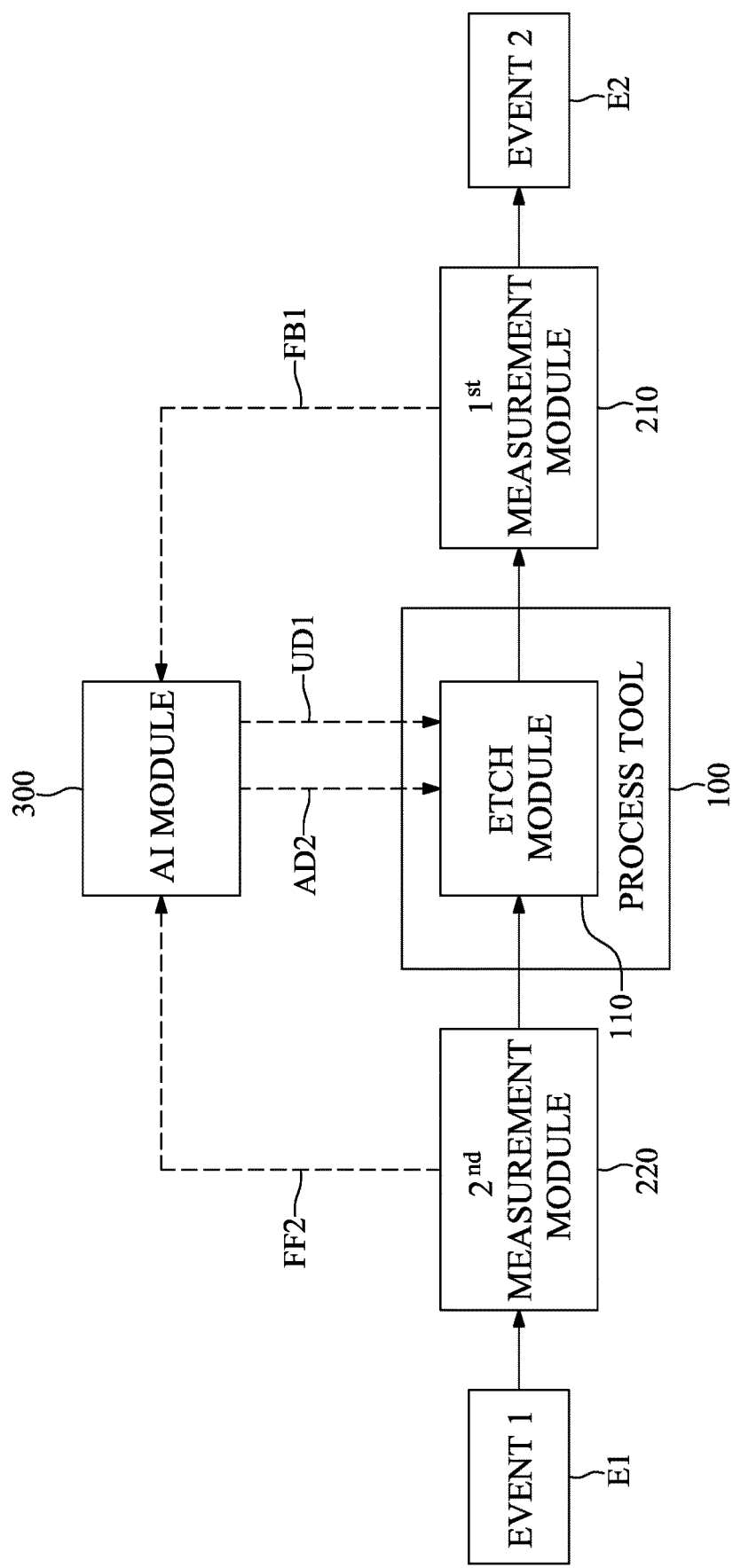

With reference to FIG. 6, the block diagram may illustrate an etching process system similar to that illustrated in FIG. 2. The same or similar elements in FIG. 6 as in FIG. 2 have been marked with similar reference numbers and duplicative descriptions have been omitted.

With reference to FIG. 6, the current wafer may be transferred to a second measurement module 220 before being processed by the process tool 100. In some embodiments, the second measurement module 220 may include a single measurement device or multiple measurement devices. The second measurement module 220 may include module related measurement devices, tool-related measurement devices, and/or external measurement devices. In the present embodiment, the second measurement module 220 may be an after-development-inspection (ADI) metrology tool. In some embodiments, the second measurement module 220 may include an optical spectrum (e.g., optical critical dimension or OCD) metrology tool to measure CD and/or profiles of etched features. The second measurement module 220 measures critical dimensions and profiles of the patterned photoresist layer or the patterned hard mask layer on the top of the current wafer. The measured CD may be feed forward to the artificial intelligence module 300 (as shown in dashed arrow FF2).

Before the process tool 100 including the etch module 110 processes the current wafer, the artificial intelligence module 300 may use the difference between the feedforward data of the second measurement module 220 and the target CD to select or calculate a set of process parameters to achieve the desired result. The adjusted recipe may be applied to the process tool 100 for processing the current wafer (as shown in dashed arrow AD2). In some embodiments, the feedforward data may also include data associated with the current wafer such as lot data, batch data, run data, composition data, and wafer history data. After the process is completed, the artificial intelligence module 300 may also update the adjusted etching recipe according to the feedback data of the first measurement module 210.

Figure 7:
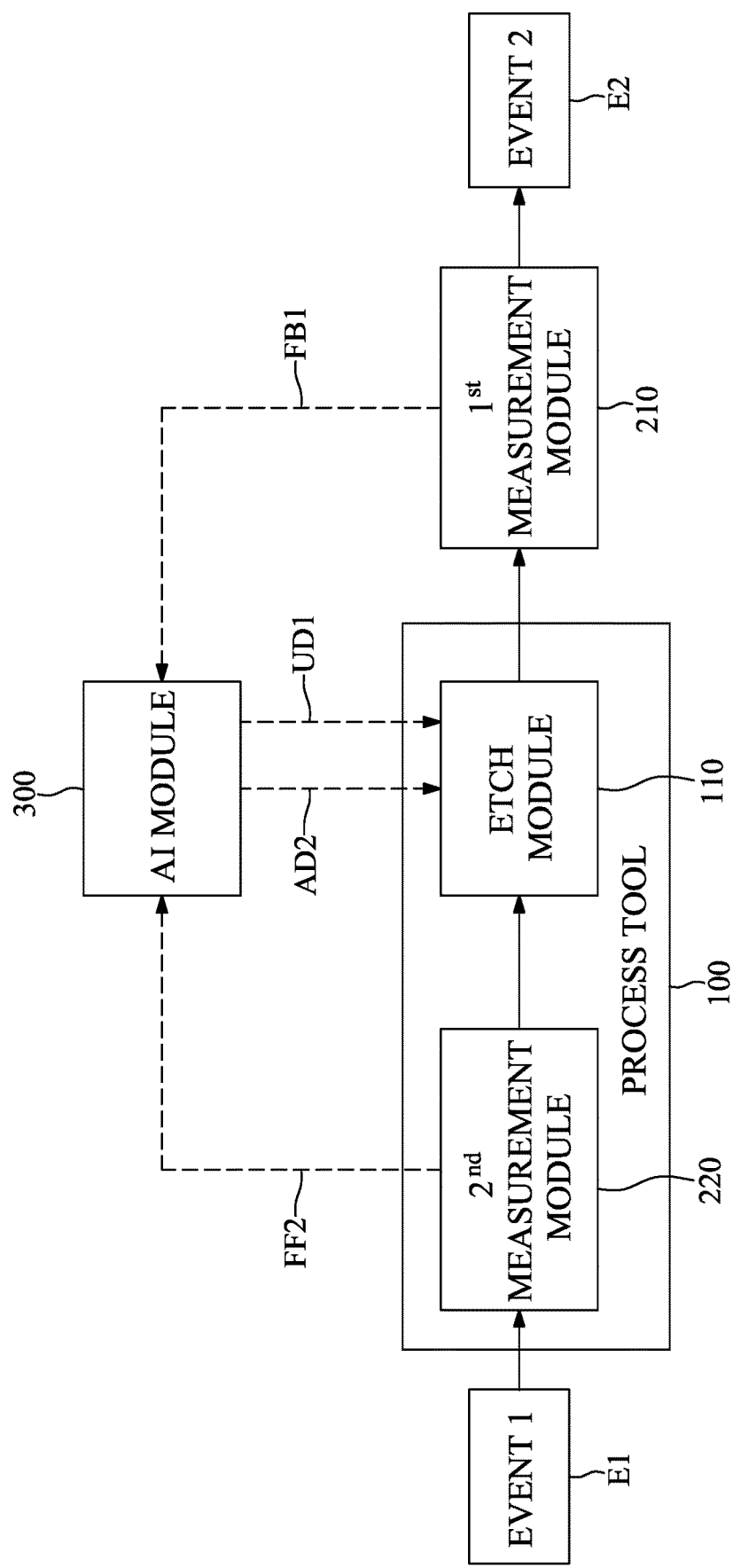

With reference to FIG. 7, the block diagram may illustrate an etching process system similar to that illustrated in FIG. 6. The same or similar elements in FIG. 7 as in FIG. 6 have been marked with similar reference numbers and duplicative descriptions have been omitted.

With reference to FIG. 7, the second measurement module 220 may be integrated within the process tool 100. In some embodiments, the second measurement module 220 may be a set of sensors which can monitor process-related parameters. The feedforward flow of the integrated second measurement module 220 may be similar to that illustrated in FIG. 6, and descriptions thereof are not repeated herein.

Figure 8:
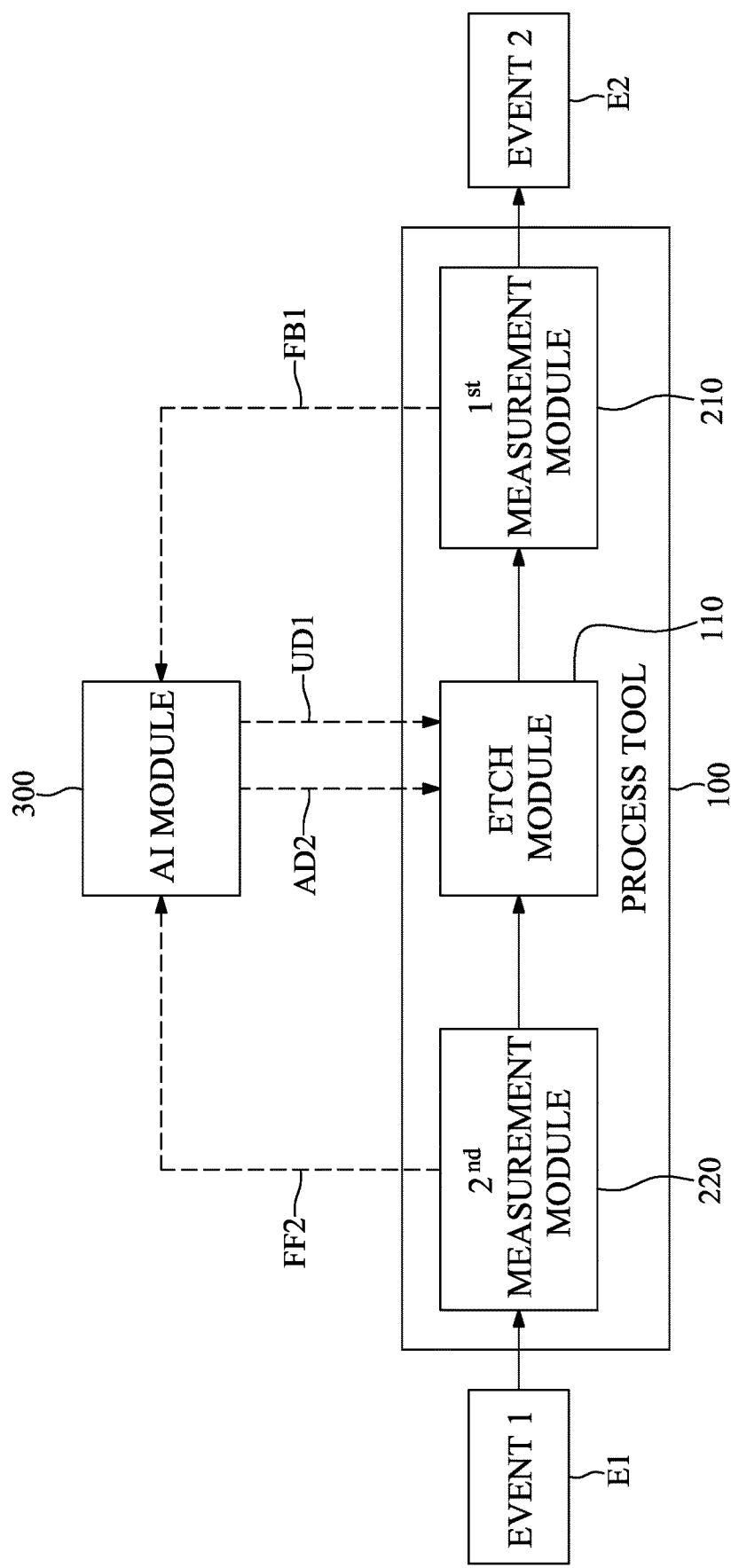

With reference to FIG. 8, the block diagram may illustrate an etching process system similar to that illustrated in FIG. 7. The same or similar elements in FIG. 8 as in FIG. 7 have been marked with similar reference numbers and duplicative descriptions have been omitted.

With reference to FIG. 8, the first measurement module 210 and the second measurement module 220 may be both integrated in the process tool 100. The feedback flow of the first measurement module 210 may be similar to that illustrated in FIG. 4, and descriptions thereof are not repeated herein. The feedforward flow of the second measurement module 220 may be similar to that illustrated in FIG. 6, and descriptions thereof are not repeated herein.

Figure 9:
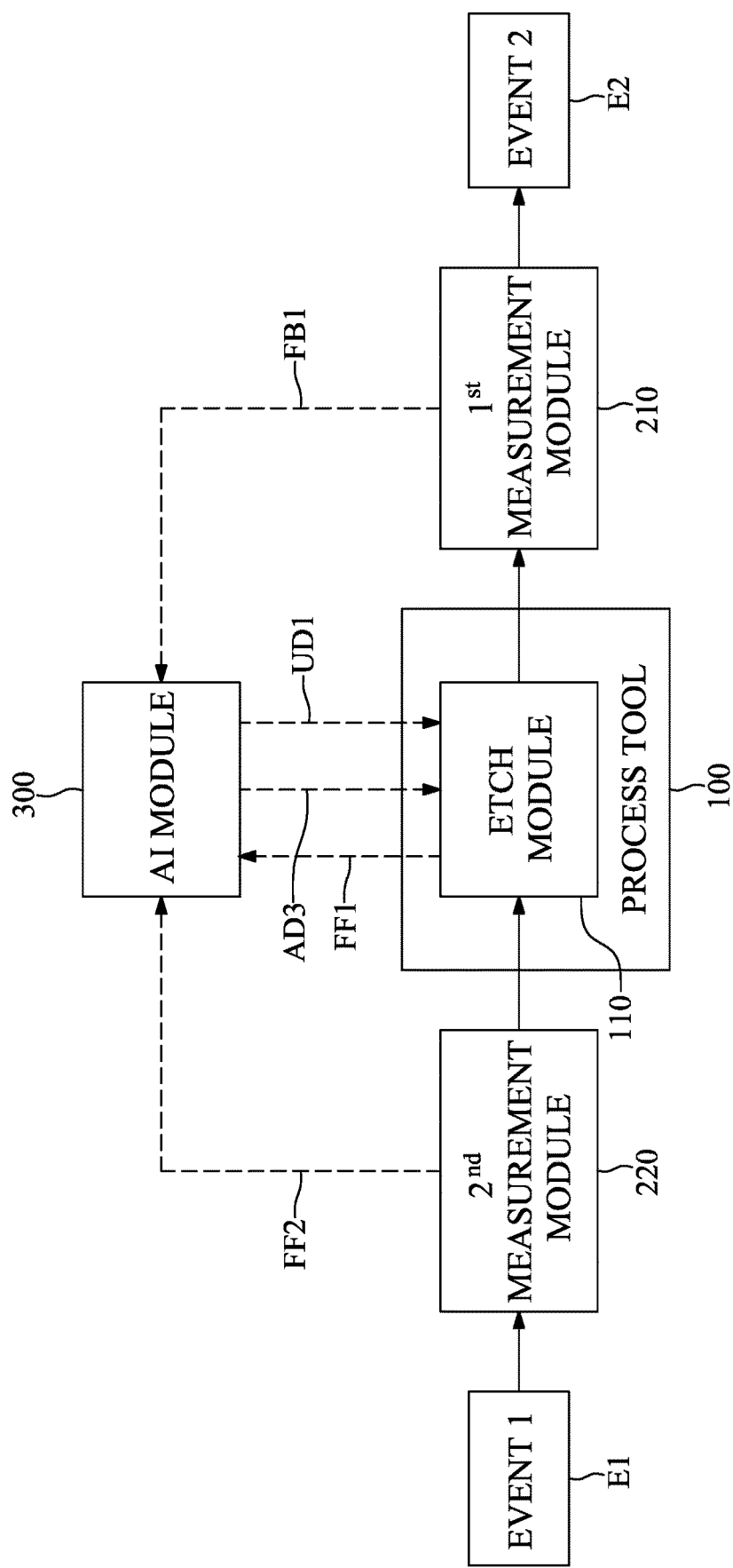

With reference to FIG. 9, the block diagram may illustrate an etching process system similar to that illustrated in FIG. 5. The same or similar elements in FIG. 9 as in FIG. 5 have been marked with similar reference numbers and duplicative descriptions have been omitted.

With reference to FIG. 9, before the process tool 100 including the etch module 110 processes the current wafer of the first event E1, the trace data of the process tool 100 such as tool trace data, maintenance data, end point detection data, and/or other process-related data may be feed forward to the artificial intelligence module 300 (as shown in dashed arrow FF1). In addition, the measured data by the second measurement module 220 may be also fed forward to the artificial intelligence module 300 (as shown in dashed arrow FF2). The artificial intelligence module 300 may analyze the trace data of the process tool 100 and the measured data by the second measurement module 220 to adjust the etching recipe for processing the current wafer (as shown in dashed arrow AD3). After the process is completed, the artificial intelligence module 300 may also update the adjusted etching recipe according to the feedback data of the first measurement module 210.

Figure 10:
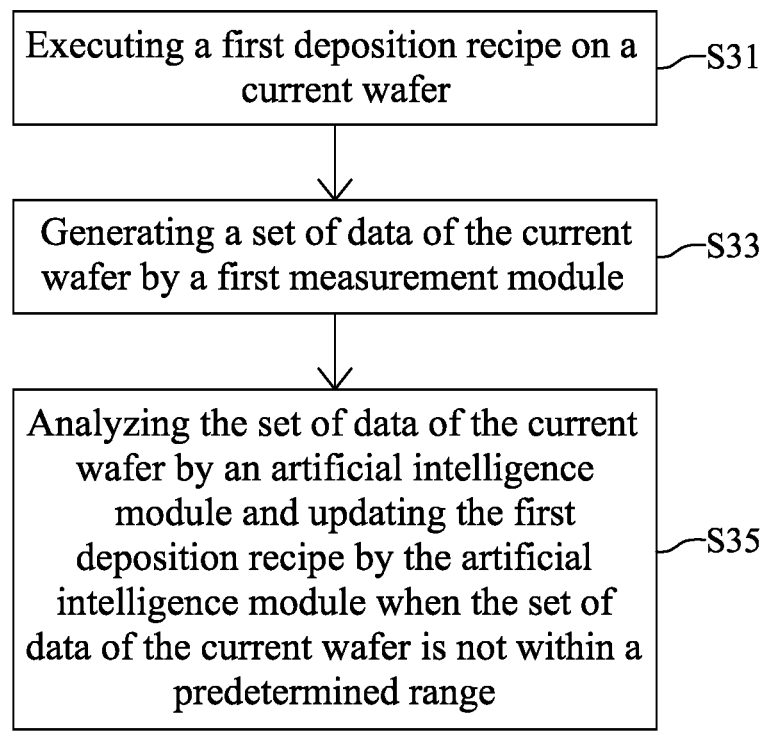
FIG. 10 illustrates, in a flowchart diagram form, a method for controlling a deposition process system in accordance with another embodiment of the present disclosure.
Figure 11:
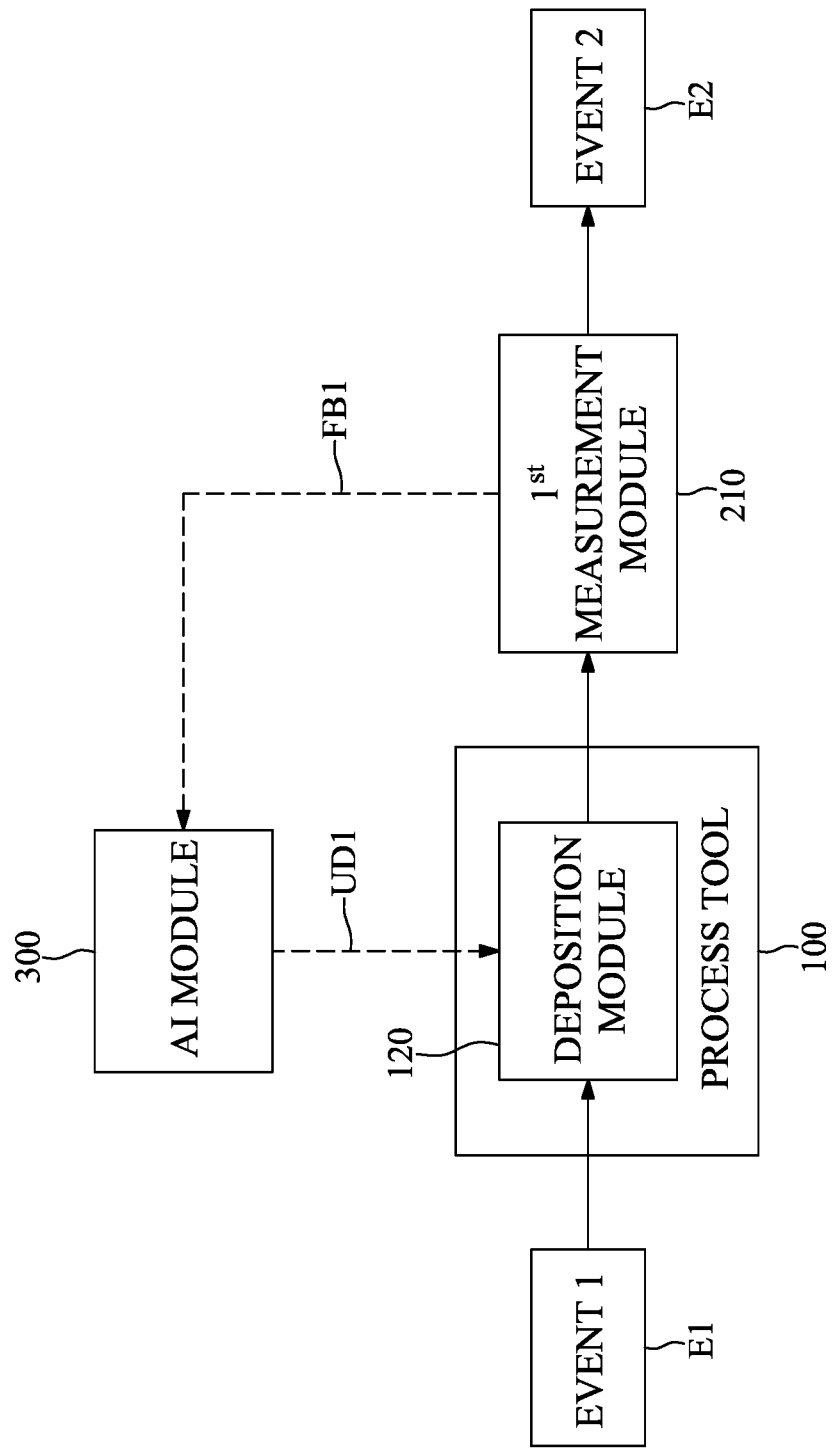
FIG. 11 illustrates an exemplary block diagram of the deposition process system in accordance with another embodiment of the present disclosure.

FIG. 10 illustrates, in a flowchart diagram form, a method 30 for controlling a deposition process system in accordance with another embodiment of the present disclosure. FIG. 11 illustrates an exemplary block diagram of the deposition process system in accordance with another embodiment of the present disclosure.

With reference to FIGS. 10 and 11, at step S31, a first deposition recipe may be executed on a current wafer.

With reference to FIG. 11, the diagram may include a material process flow, illustrated as solid lines, and an information flow, illustrated as dashed lines. The material process flow may include part of the process for depositing a semiconductor substrate, such as, for example, a wafer.

In some embodiments, the first event E1 may be a wafer-in event to transfer the current wafer into the process tool 100 which provides means for changing the current wafer from a first state to a second state. In the present embodiment, the process tool 100 may include a deposition module 120. That is, in the present embodiment, the material process flow may include a deposition process for the current wafer.

In some embodiments, the process tool 100 may include a GUI component and a database similar to that illustrated in FIG. 2, and descriptions thereof are not repeated herein.

With reference to FIG. 11, the artificial intelligence module 300 may be coupled to the deposition module 120 of the process tool 100. The communication between the process tool 100 and the artificial intelligence module 300 may be similar to that illustrated in FIG. 2, and descriptions thereof are not repeated herein. In some embodiments, the artificial intelligence module 300 may be integrated in the process tool 100.

In some embodiments, the deposition module 120 may include a deposition chamber that is not separately illustrated. The current wafer may be placed in the deposition chamber, and then may be subjected to the deposition process employing a deposition recipe. The deposition recipe for the current wafer may also be referred to as the first deposition recipe). In some embodiments, the first deposition recipe may be a nominal recipe.

With reference to FIG. 11, after the deposition process of the deposition module 120 using the first deposition recipe, the wafer state of the current wafer may be turned into the second state (after the deposition process) from the first state (before the deposition process) by the deposition module 120 of the process tool 100.

With reference to FIGS. 10 and 11, at step S33, a set of data of the current wafer may be generated by a first measurement module 210.

Then, the current processed wafer may be transferred to the first measurement module 210. The first measurement module 210 may collect data of the second state of the current processed wafer. In some embodiments, the first measurement module 210 may include a single measurement device or multiple measurement devices. The first measurement module 210 may include process module related measurement devices, tool-related measurement devices, and/or external measurement devices. In the present embodiment, the first measurement module 210 may be a metrology tool for measuring film thickness.

With reference to FIGS. 10 and 11, at step S35, the set of data of the current wafer may be analyzed by the artificial intelligence module 300 and the first deposition recipe may be updated by the artificial intelligence module when the set of data of the current wafer is not within a predetermined range.

With reference to FIG. 11, in some embodiments, the film thickness of the current processed wafer collected by the first measurement module 210 after the deposition process may be analyzed by the artificial intelligence module 300 to determine that the film thickness is within a predetermined range. If the film thickness is not within the predetermined range, the data (as shown in dashed arrow FB1) of current processed wafer collected by the first measurement module 210 may be fed backed to the artificial intelligence module 300 which coupled to the process tool 100 or, detailedly, to the deposition module 120 of the process tool 100. The artificial intelligence module 300 may update the first deposition recipe according to the feedback film thickness data to provide a second deposition recipe for the next wafer (as shown in dashed arrow UD1).

In some embodiments, the artificial intelligence module 300 may use the film thickness of the current processed wafer collected by the first measurement module 210 after the deposition process to compute a set of process deviations. This computed set of process deviations may be determined based on the target film thickness and the film thickness of the current processed wafer collected by the first measurement module 210 after the deposition process. The set of process deviations may be used to determine a correction to the first deposition recipe for the next wafer to be processed. In the description of the present disclosure, a target film thickness indicates the desired film thickness after the deposition process is completed.

In some embodiments, the artificial intelligence module 300 may use table-based and/or formula-based techniques. For example, the recipes may be in a table, and the artificial intelligence module 300 does a table lookup to determine which correction or corrections provide the best solutions. Alternately, the corrections may be determined using a set of formulas, and the artificial intelligence module 300 determines which correction formula or corrections formulas provide the best solutions.

When the artificial intelligence module 300 uses table-based techniques, the feedback control variables are configurable. For example, a variable can be a constant or coefficient in the table. In addition, there can be multiple tables, and rule-based switching can be accomplished based on an input range or an output range.

When the artificial intelligence module 300 uses formula-based control, the feedback control variables are configurable. For example, a variable can be a constant or coefficient in the formula. In addition, there can be multiple formula combinations, and rule-based switching can be accomplished based on an input range or an output range.

With reference to FIG. 11, the second event E2 may represent a following process for the current process wafer. In the present embodiment, the second event E2 may be a planarization process, or other applicable processes.

By employing the artificial intelligence module 300 coupled with the process tool 100, the related process recipe (e.g., the deposition recipe in the present embodiment) may be updated (or adjusted) on a wafer-to-wafer time frame. As a result, the yield and/or reliability of the wafers may be improved.

Figure 12:
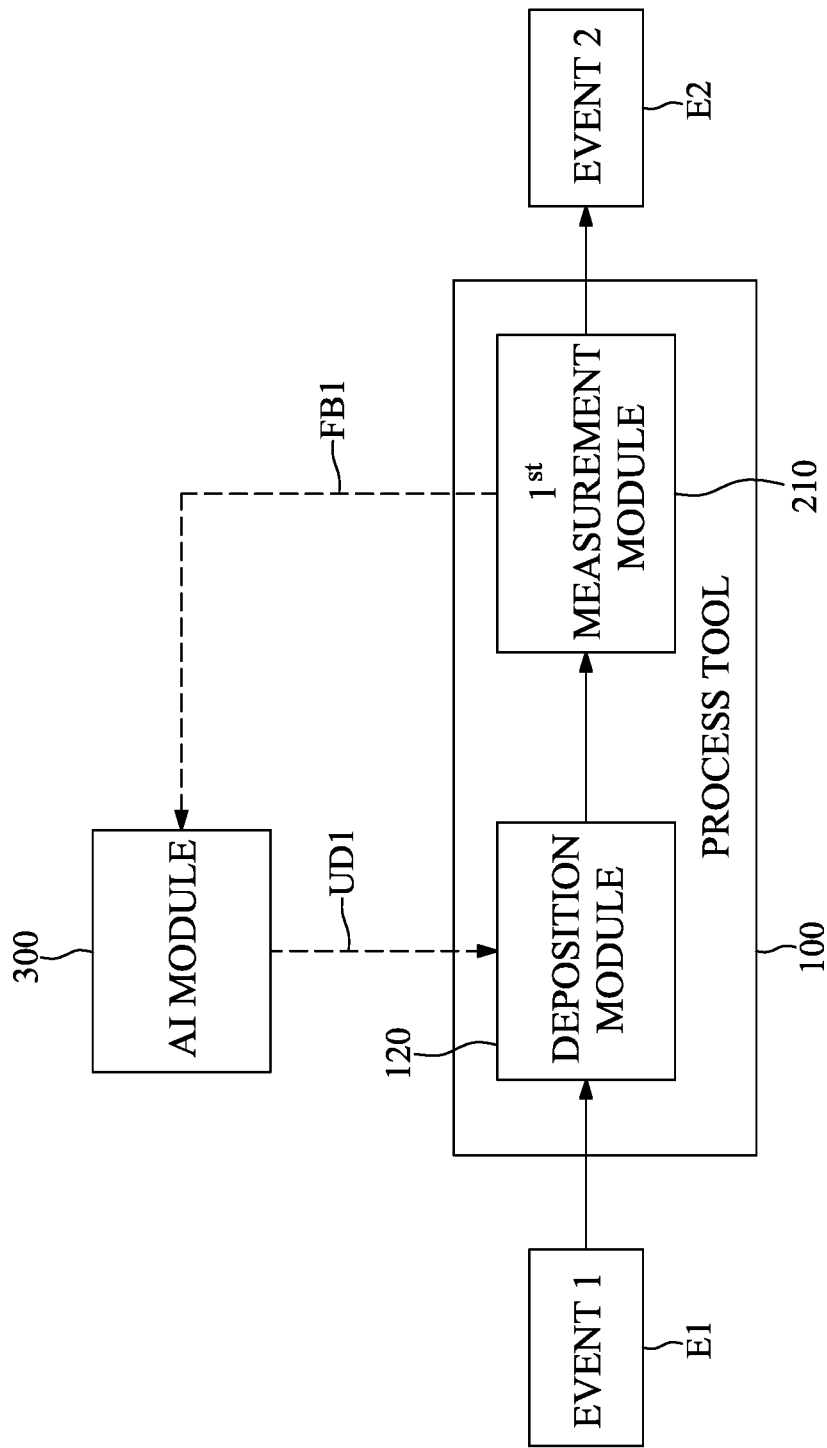
FIGS. 12 and 13 illustrate exemplary block diagrams of deposition process systems in accordance with some embodiments of the present disclosure.
Figure 13:
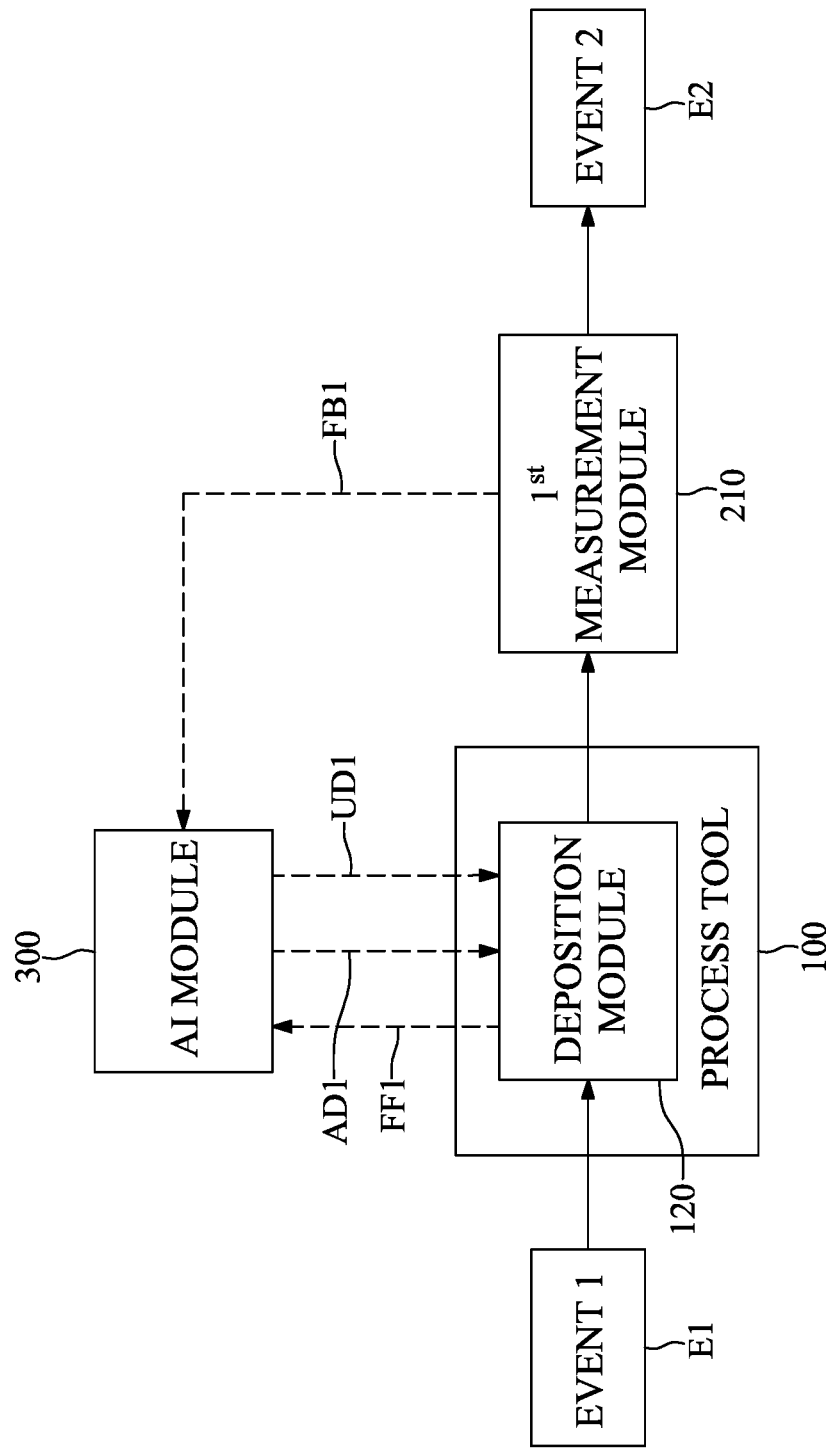

FIGS. 12 and 13 illustrate exemplary block diagrams of deposition process systems in accordance with some embodiments of the present disclosure.

With reference to FIG. 12, the block diagram may illustrate a deposition process system similar to that illustrated in FIG. 11. The same or similar elements in FIG. 12 as in FIG. 11 have been marked with similar reference numbers and duplicative descriptions have been omitted.

With reference to FIG. 12, the first measurement module 210 may be integrated within the process tool 100. In some embodiments, the first measurement module 210 may be a set of sensors which can monitor process-related parameters such as gas flow, gas ratio, or other applicable process-related parameters.

With reference to FIG. 12, the first measurement module 210 may provide feedback data to the artificial intelligence module 300 in a real time manner. Accordingly, the artificial intelligence module 300 may update the deposition recipe immediately. For example, the first deposition recipe may be a multi-stage recipe such as a two-stage recipe. The first measurement module 210 may continuously monitor process-related parameters during the first stage of the first deposition recipe and feed back to the artificial intelligence module 300 (as shown in dashed arrow FB1). Meanwhile, the artificial intelligence module 300 may analyze the feedback data to determine whether to update the second stage of the first deposition recipe or not. If the first stage of the first deposition recipe includes a process deviation, the artificial intelligence module 300 can make correction and update (as shown in dashed arrow UD1) the second stage of the deposition etching process to make the processed wafer have parameters (e.g., the film thickness) within the accepted criteria.

Accordingly, the first measurement module 210 may also continuously monitor process-related parameters during and after the second stage of the first deposition process and feed back to the artificial intelligence module 300. Meanwhile, the artificial intelligence module 300 may analyze the feedback data to determine whether to update the first deposition recipe for the next wafer to be processed.

With reference to FIG. 13, the block diagram may illustrate a deposition process system similar to that illustrated in FIG. 11. The same or similar elements in FIG. 13 as in FIG. 11 have been marked with similar reference numbers and duplicative descriptions have been omitted.

With reference to FIG. 13, before the process tool 100 including the deposition module 120 processes the current wafer of the first event E1, the trace data of the process tool 100 such as tool trace data, maintenance data, and/or other process-related data may be fed forward to the artificial intelligence module 300 (as shown in dashed arrow FF1). The artificial intelligence module 300 may analyze the trace data of the process tool 100 to adjust the deposition recipe for processing the current wafer (as shown in dashed arrow AD1). After the process is completed, the artificial intelligence module 300 may also update the adjusted deposition recipe according to the feedback data of the first measurement module 210.

Figure 14:
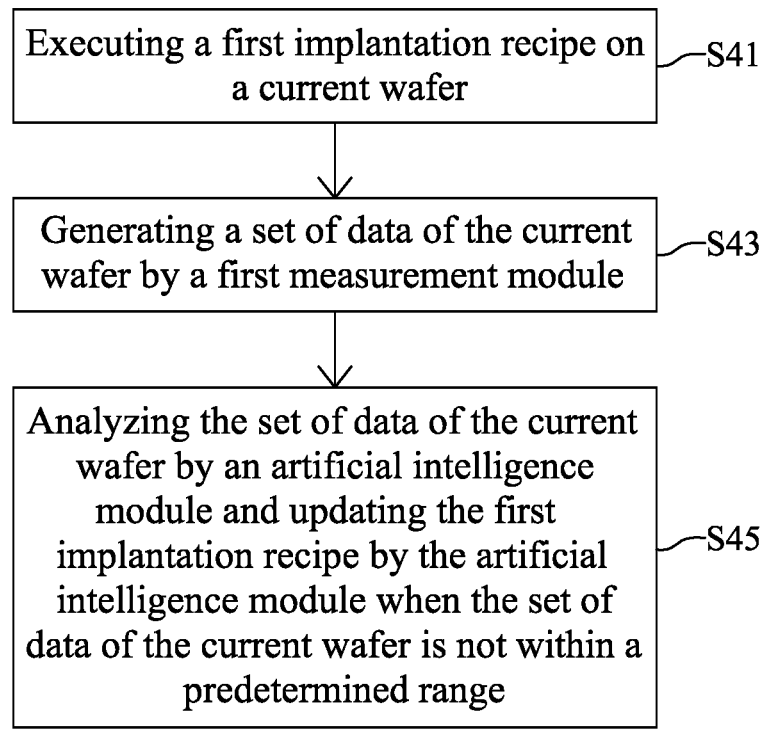
FIG. 14 illustrates, in a flowchart diagram form, a method for controlling an implantation process system in accordance with another embodiment of the present disclosure.
Figure 15:
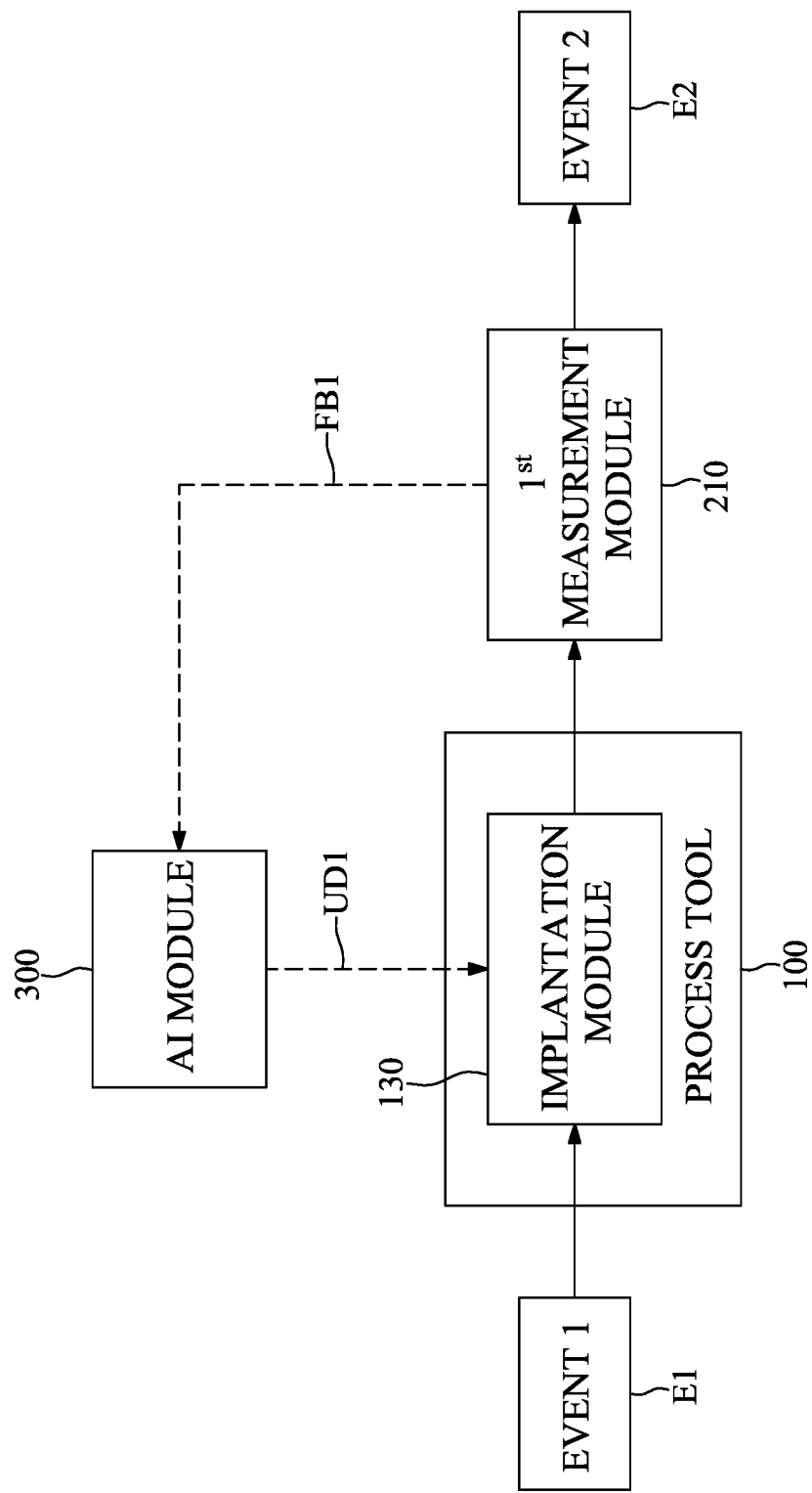
FIG. 15 illustrates an exemplary block diagram of the implantation process system in accordance with another embodiment of the present disclosure.

FIG. 14 illustrates, in a flowchart diagram form, a method 40 for controlling an implantation process system in accordance with another embodiment of the present disclosure. FIG. 15 illustrates an exemplary block diagram of the implantation process system in accordance with another embodiment of the present disclosure.

With reference to FIGS. 14 and 15, at step S41, a first implantation recipe may be executed on a current wafer.

With reference to FIG. 15, the diagram may include a material process flow, illustrated as solid lines, and an information flow, illustrated as dashed lines. The material process flow may include part of the process for implanting a semiconductor substrate, such as, for example, a wafer.

In some embodiments, the first event E1 may be a wafer-in event to transfer the current wafer into the process tool 100 which provides means for changing the current wafer from a first state to a second state. In the present embodiment, the process tool 100 may include an implantation module 130. That is, in the present embodiment, the material process flow may include an implantation process for the current wafer.

In some embodiments, the process tool 100 may include a GUI component and a database similar to that illustrated in FIG. 2, and descriptions thereof are not repeated herein.

With reference to FIG. 15, the artificial intelligence module 300 may be coupled to the implantation module 130 of the process tool 100. The communication between the process tool 100 and the artificial intelligence module 300 may be similar to that illustrated in FIG. 2, and descriptions thereof are not repeated herein. In some embodiments, the artificial intelligence module 300 may be integrated in the process tool 100.

In some embodiments, the implantation module 130 may include an implantation chamber that is not separately illustrated. The current wafer may be placed in the implantation chamber, and then may be subjected to the implantation process employing an implantation recipe. The implantation recipe for the current wafer may also be referred to as the first implantation recipe. In some embodiments, the first implantation recipe may be a nominal recipe.

With reference to FIG. 15, after the implantation process of the implantation module 130 using the first implantation recipe, the wafer state of the current wafer may be turned into the second state (after the implantation process) from the first state (before the implantation process) by the implantation module 130 of the process tool 100.

With reference to FIGS. 14 and 15, at step S43, a set of data of the current wafer may be generated by a first measurement module 210.

Then, the current processed wafer may be transferred to the first measurement module 210. The first measurement module 210 may collect data of the second state of the current processed wafer. In some embodiments, the first measurement module 210 may include a single measurement device or multiple measurement devices. The first measurement module 210 may include process module related measurement devices, tool-related measurement devices, and/or external measurement devices. In the present embodiment, the first measurement module 210 may be a metrology tool for measuring, for example, electrical data such as resistance.

With reference to FIGS. 14 and 15, at step S45, the set of data of the current wafer may be analyzed by the artificial intelligence module 300 and the first implantation recipe may be updated by the artificial intelligence module when the set of data of the current wafer is not within a predetermined range.

With reference to FIG. 15, in some embodiments, the electrical data of the current processed wafer collected by the first measurement module 210 after the implantation process may be analyzed by the artificial intelligence module 300 to determine that the electrical data are within a predetermined range. If the electrical data are not within the predetermined range, the data (as shown in dashed arrow FB1) of current processed wafer collected by the first measurement module 210 may be fed back to the artificial intelligence module 300 which coupled to the process tool 100 or, detailedly, to the implantation module 130 of the process tool 100. The artificial intelligence module 300 may update the first implantation recipe according to the feedback electrical data to provide a second implantation recipe for the next wafer (as shown in dashed arrow UD1).

In some embodiments, the artificial intelligence module 300 may use the electrical data of the current processed wafer collected by the first measurement module 210 after the implantation process to compute a set of process deviations. This computed set of process deviations may be determined based on the target electrical data and the electrical data of the current processed wafer collected by the first measurement module 210 after the implantation process. The set of process deviations may be used to determine a correction to the first implantation recipe for the next wafer to be processed. In the description of the present disclosure, a target electrical data indicates the desired electrical data after the implantation process is completed.

In some embodiments, the artificial intelligence module 300 may use table-based and/or formula-based techniques. For example, the recipes may be in a table, and the artificial intelligence module 300 does a table lookup to determine which correction or corrections provide the best solutions. Alternately, the corrections may be determined using a set of formulas, and the artificial intelligence module 300 determines which correction formula or corrections formulas provide the best solutions.

When the artificial intelligence module 300 uses table-based techniques, the feedback control variables are configurable. For example, a variable can be a constant or coefficient in the table. In addition, there can be multiple tables, and rule-based switching can be accomplished based on an input range or an output range.

When the artificial intelligence module 300 uses formula-based control, the feedback control variables are configurable. For example, a variable can be a constant or coefficient in the formula. In addition, there can be multiple formula combinations, and rule-based switching can be accomplished based on an input range or an output range.

With reference to FIG. 15, the second event E2 may represent a following process for the current process wafer. In the present embodiment, the second event E2 may be a deposition process, or other applicable processes.

By employing the artificial intelligence module 300 coupled with the process tool 100, the related process recipe (e.g., the implantation recipe in the present embodiment) may be updated (or adjust) on a wafer-to-wafer time frame. As a result, the yield and/or reliability of the wafers may be improved.

Figure 16:
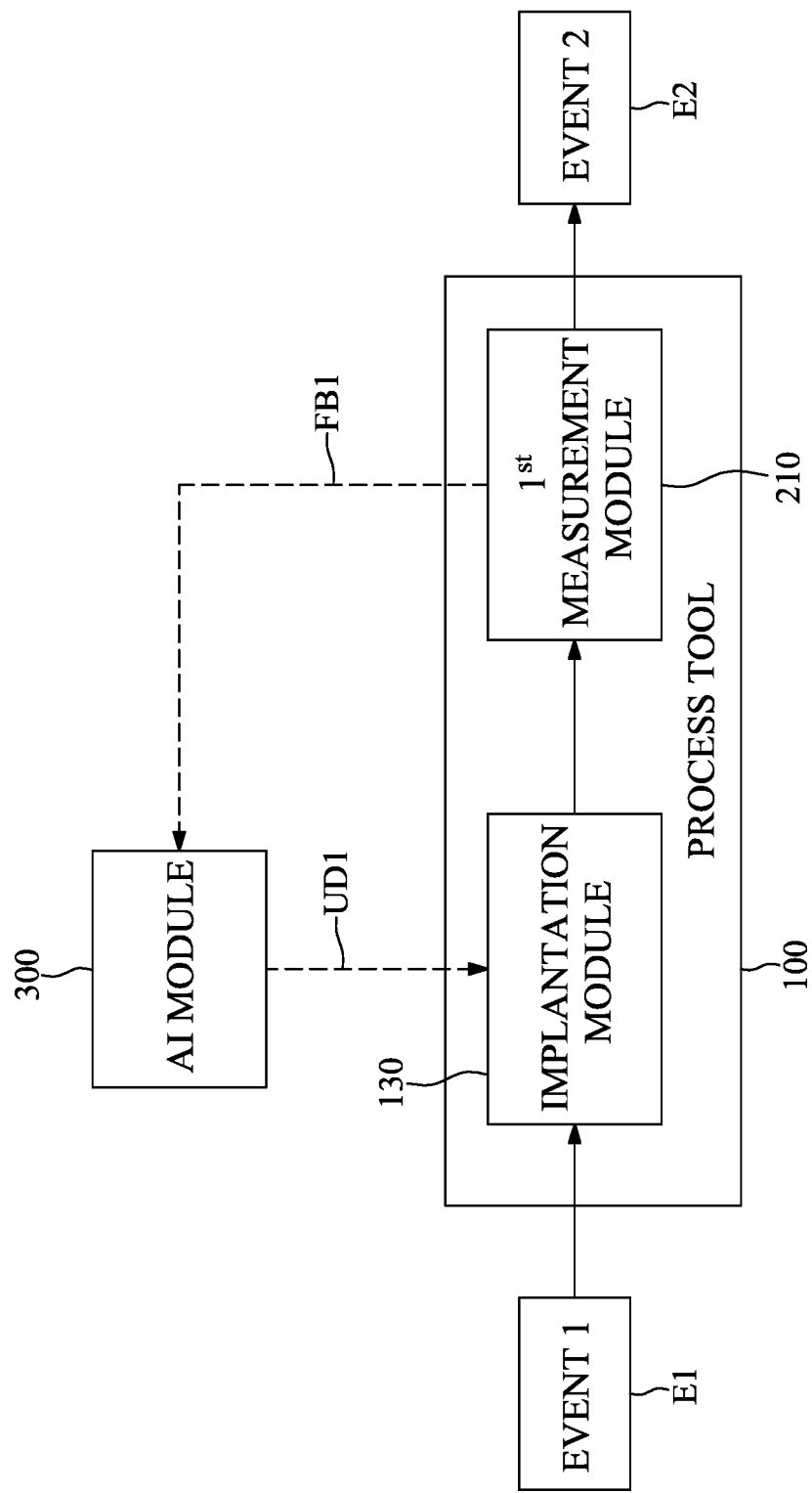
FIGS. 16 and 17 illustrate exemplary block diagrams of implantation process systems in accordance with some embodiments of the present disclosure.
Figure 17:
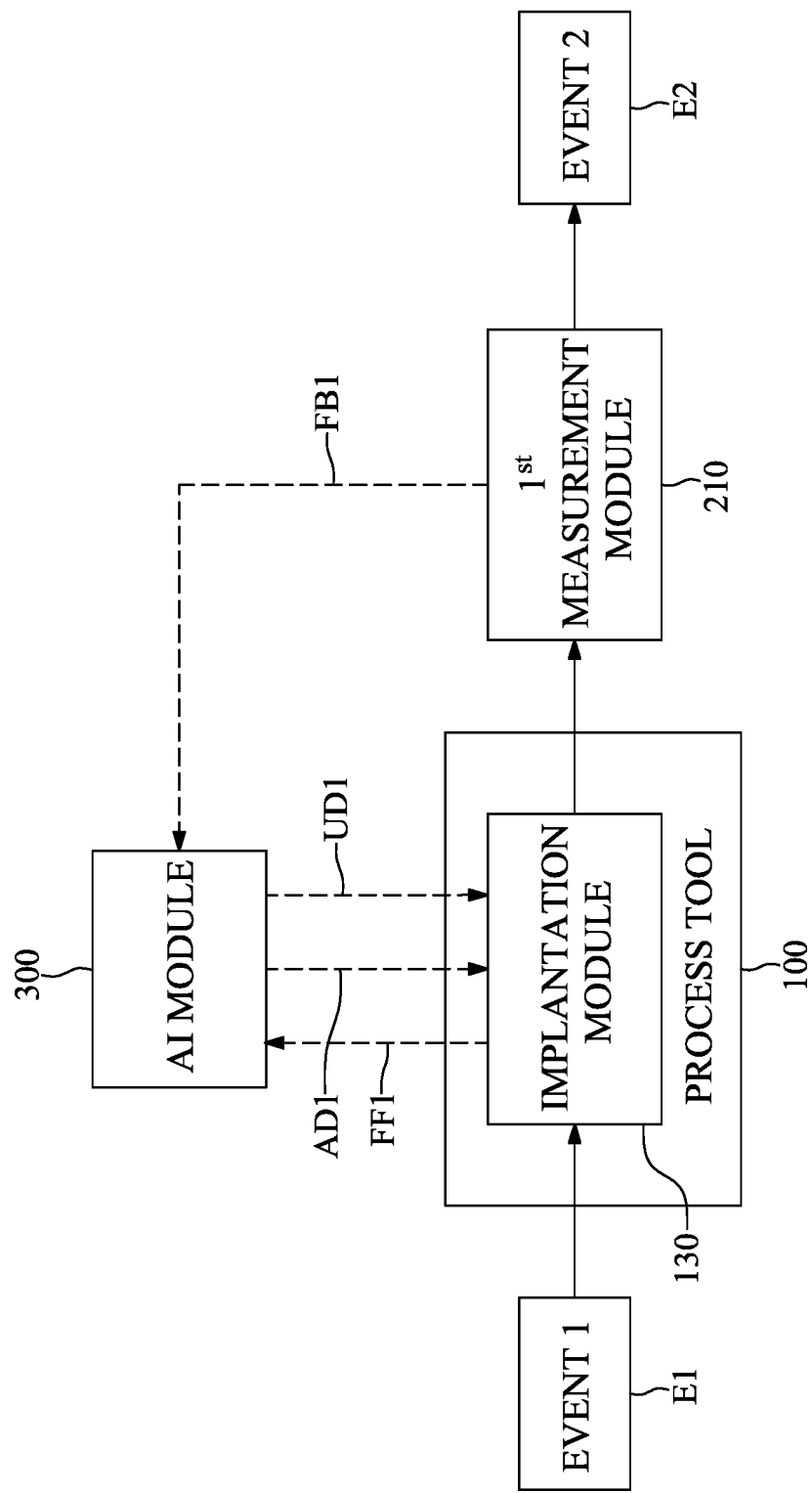

FIGS. 16 and 17 illustrate exemplary block diagrams of implantation process systems in accordance with some embodiments of the present disclosure.

With reference to FIG. 16, the block diagram may illustrate a deposition process system similar to that illustrated in FIG. 15. The same or similar elements in FIG. 16 as in FIG. 15 have been marked with similar reference numbers and duplicative descriptions have been omitted.

With reference to FIG. 16, the first measurement module 210 may be integrated within the process tool 100. In some embodiments, the first measurement module 210 may be a set of sensors which can monitor process-related parameters such as implanting energy, implanting dosage, or other applicable process-related parameters.

With reference to FIG. 16, the first measurement module 210 may provide feedback data to the artificial intelligence module 300 in a real time manner. Accordingly, the artificial intelligence module 300 may update the implantation recipe immediately. For example, the first implantation recipe may be a multi-stage recipe such as a two-stage recipe. The first measurement module 210 may continuously monitor process-related parameters during the first stage of the first implantation recipe and fed back to the artificial intelligence module 300 (as shown in dashed arrow FB1). Meanwhile, the artificial intelligence module 300 may analyze the feedback data to determine whether to update the second stage of the first implantation recipe or not. If the first stage of the first implantation recipe includes a process deviation, the artificial intelligence module 300 can make correction and update (as shown in dashed arrow UD1) the second stage of the implantation etching process to make the processed wafer have parameters (e.g., the electrical data) within the accepted criteria.

Accordingly, the first measurement module 210 may also continuously monitor process-related parameters during and after the second stage of the first implantation process and feed back to the artificial intelligence module 300. Meanwhile, the artificial intelligence module 300 may analyze the feedback data to determine whether to update the first implantation recipe for the next wafer to be processed.

With reference to FIG. 17, the block diagram may illustrate an implantation process system similar to that illustrated in FIG. 15. The same or similar elements in FIG. 17 as in FIG. 15 have been marked with similar reference numbers and duplicative descriptions have been omitted.

With reference to FIG. 17, before the process tool 100 including the implantation module 130 processes the current wafer of the first event E1, the trace data of the process tool 100 such as tool trace data, maintenance data, and/or other process-related data may be feedforward to the artificial intelligence module 300 (as shown in dashed arrow FF1). The artificial intelligence module 300 may analyze the trace data of the process tool 100 to adjust the implantation recipe for processing the current wafer (as shown in dashed arrow AD1). After the process is completed, the artificial intelligence module 300 may also update the adjusted implantation recipe according to the feedback data of the first measurement module 210.

Figure 18:
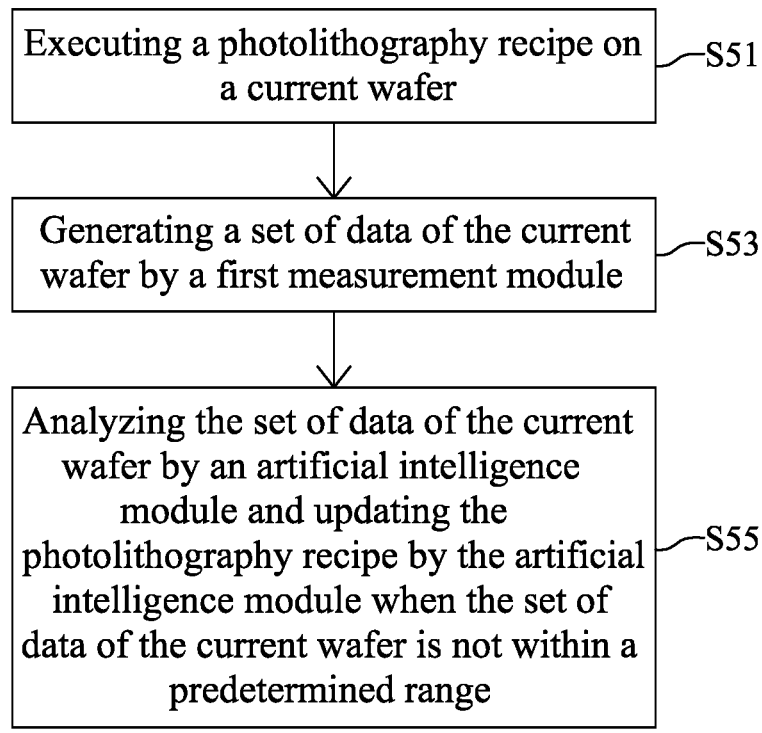
FIG. 18 illustrates, in a flowchart diagram form, a method for controlling a photolithography process system in accordance with another embodiment of the present disclosure.
Figure 19:
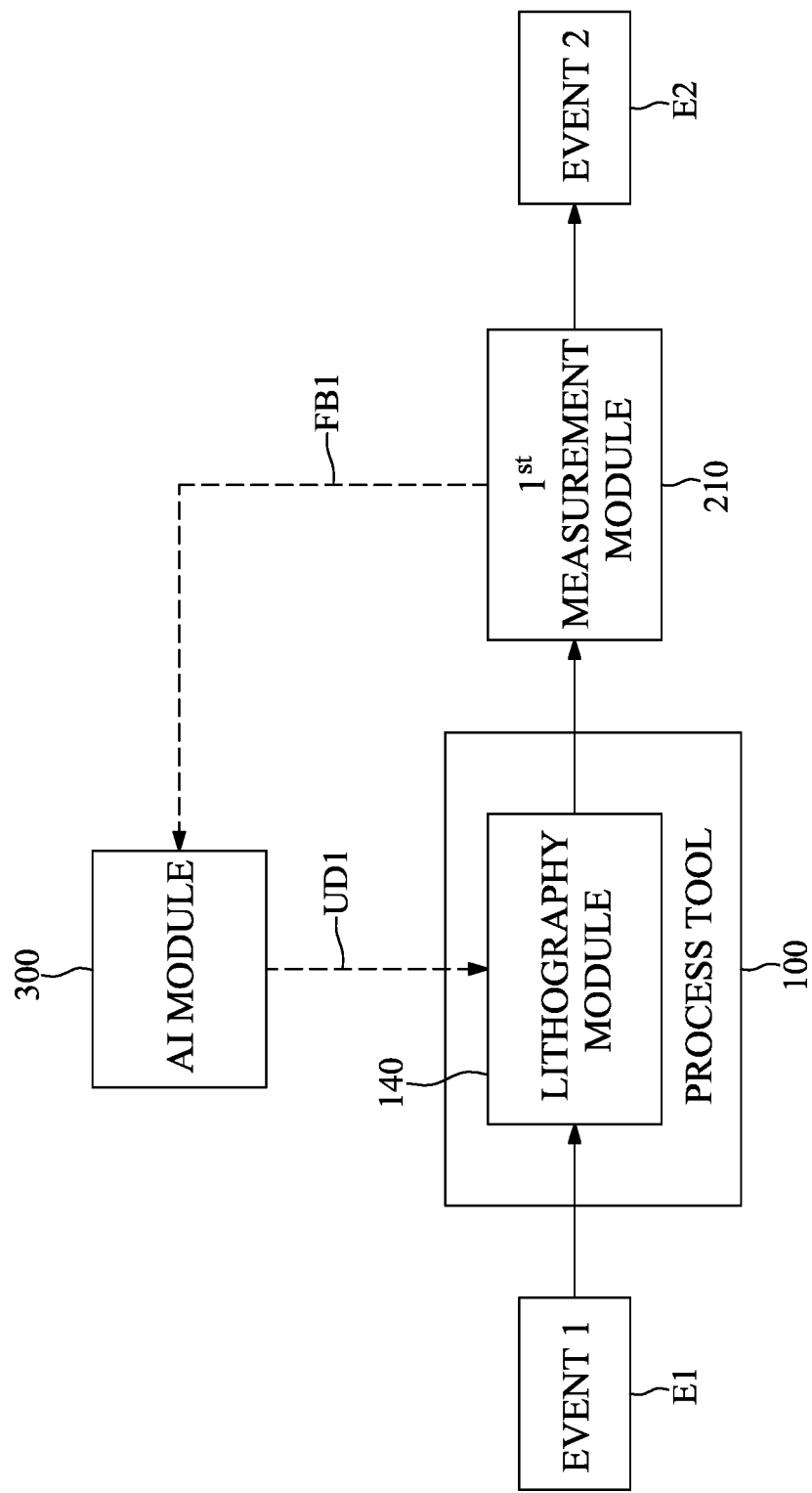
FIG. 19 illustrates an exemplary block diagram of the photolithography process system in accordance with another embodiment of the present disclosure.

FIG. 18 illustrates, in a flowchart diagram form, a method 50 for controlling a photolithography process system in accordance with another embodiment of the present disclosure. FIG. 19 illustrates an exemplary block diagram of the photolithography process system in accordance with another embodiment of the present disclosure.

With reference to FIGS. 18 and 19, at step S51, a photolithography recipe may be executed on a current wafer.

With reference to FIG. 19, the diagram may include a material process flow, illustrated as solid lines, and an information flow, illustrated as dashed lines. The material process flow may include part of the process for performing a photolithography process on a semiconductor substrate, such as, for example, a wafer.

In some embodiments, the first event E1 may be a wafer-in event to transfer the current wafer into the process tool 100 which provides means for changing the current wafer from a first state to a second state. In the present embodiment, the process tool 100 may include a lithography module 140. That is, in the present embodiment, the material process flow may include a photolithography process for the current wafer.

In some embodiments, the process tool 100 may include a GUI component and a database similar to that illustrated in FIG. 2, and descriptions thereof are not repeated herein.

With reference to FIG. 19, the artificial intelligence module 300 may be coupled to the lithography module 140 of the process tool 100. The communication between the process tool 100 and the artificial intelligence module 300 may be similar to that illustrated in FIG. 2, and descriptions thereof are not repeated herein. In some embodiments, the artificial intelligence module 300 may be integrated in the process tool 100.

The current wafer may be subjected to the photolithography process employing the photolithography recipe. The photolithography recipe for the current wafer may also be referred to as the first photolithography recipe). In some embodiments, the first photolithography recipe may be a nominal recipe.

With reference to FIG. 19, after the photolithography process of the lithography module 140 using the photolithography recipe, the wafer state of the current wafer may be turned into the second state (after photolithography process) from the first state (before photolithography process) by the lithography module 140 of the process tool 100.

With reference to FIGS. 18 and 19, at step S53, a set of data of the current wafer may be generated by a first measurement module 210.

Then, the current processed wafer may be transferred to the first measurement module 210. The first measurement module 210 may collect data of the second state of the current processed wafer. In some embodiments, the first measurement module 210 may include a single measurement device or multiple measurement devices. The first measurement module 210 may include process module related measurement devices, tool-related measurement devices, and/or external measurement devices. In the present embodiment, the first measurement module 210 may be an after-development-inspection (ADI) metrology tool. In some embodiments, the first measurement module 210 may include an optical spectrum (e.g., optical critical dimension or OCD) metrology tool to measure CD and/or profiles of etched features. The first measurement module 210 measures critical dimensions and profiles of the patterned photoresist layer on the top of the current wafer.

With reference to FIGS. 18 and 19, at step S55, the set of data of the current wafer may be analyzed by the artificial intelligence module 300 and the photolithography recipe may be updated by the artificial intelligence module when the set of data of the current wafer is not within a predetermined range.

In some embodiments, the CD of the current processed wafer collected by the first measurement module 210 after the photolithography process may be analyzed by the artificial intelligence module 300 to determine that the CD is within a predetermined range. If the CD is not within the predetermined range, the data (as shown in dashed arrow FB1) of current processed wafer collected by the first measurement module 210 may be fed backed to the artificial intelligence module 300 which coupled to the process tool 100 or, detailedly, to the lithography module 140 of the process tool 100. The artificial intelligence module 300 may update the first photolithography recipe according to the feedback CD data to provide a second photolithography recipe for the next wafer (as shown in dashed arrow UD1).

In some embodiments, the artificial intelligence module 300 may use the CD of the current processed wafer collected by the first measurement module 210 after the photolithography process to compute a set of process deviations. This computed set of process deviations may be determined based on the target CD and the CD of the current processed wafer collected by the first measurement module 210 after the photolithography process. The set of process deviations may be used to determine a correction to the first photolithography recipe for the next wafer to be processed.

In some embodiments, the artificial intelligence module 300 may use table-based and/or formula-based techniques. For example, the recipes may be in a table, and the artificial intelligence module 300 does a table lookup to determine which correction or corrections provide the best solutions. Alternately, the corrections may be determined using a set of formulas, and the artificial intelligence module 300 determines which correction formula or corrections formulas provide the best solutions.

When the artificial intelligence module 300 uses table-based techniques, the feedback control variables are configurable. For example, a variable can be a constant or coefficient in the table. In addition, there can be multiple tables, and rule-based switching can be accomplished based on an input range or an output range.

When the artificial intelligence module 300 uses formula-based control, the feedback control variables are configurable. For example, a variable can be a constant or coefficient in the formula. In addition, there can be multiple formula combinations, and rule-based switching can be accomplished based on an input range or an output range.

With reference to FIG. 19, the second event E2 may represent a following process for the current process wafer. In the present embodiment, the second event E2 may be an etching process, or other applicable processes.

By employing the artificial intelligence module 300 coupled with the process tool 100, the related process recipe (e.g., the photolithography recipe in the present embodiment) may be updated (or adjusted) on a wafer-to-wafer time frame. As a result, the yield and/or reliability of the wafers may be improved.

In some embodiments, the artificial intelligence module 300 may receive a first set of data that describes the current wafer before processing. For example, the first set of data may be from a measurement device such as an ADI tool. In addition, the first set of data may include SEM data and optical data. Also, the first set of data may include wafer data including physical data, electrical data, and processing data.

In some embodiments, the artificial intelligence module 300 may make a recipe selection and feed forward the selection to the process tool 100. The artificial intelligence module 300 may use a table-based and/or a formula-based technique for determining the best recipe. The artificial intelligence module 300 may receive information about current wafer to be processed and the desired process results, and then provide at least one recipe selection that it has determined will achieve the desired process results. The artificial intelligence module 300 may apply limits to the received information and may provide windows around the desired process results. The artificial intelligence module 300 may include the current recipe and a nominal recipe in the selection process.

In some embodiments, the artificial intelligence module 300 may receive process data. For example, the process data can be from the processing tool, the process module (chamber), and/or a process sensor (e.g., the first measurement module 210 integrated in the process tool 100).

In some embodiments, the artificial intelligence module 300 may determine a set of results based on the current wafer state and at least one process model. For example, the process model may be based on the current state of the process module (chamber).

In some embodiments, the artificial intelligence module 300 may receive a second set of data that describes the current wafer after processing. For example, the second set of data may be from a measurement device such as an AEI tool. In addition, the second set of data may include SEM data and optical data. Also, the second set of data may include wafer data including physical data, electrical data, and processing data.

In some embodiments, the artificial intelligence module 300 may use a table-based and/or a formula-based technique for determining the corrections according to the second set of data. The artificial intelligence module 300 may receive information about the current wafer after processing and the desired process results, and the artificial intelligence module 300 may provide at least one correction that it has determined represents the difference between the achieved results (after processing) and the desired process results. The artificial intelligence module 300 may apply limits to the received information and may provide windows around the corrections. The artificial intelligence module 300 may include the current data, delayed data, and/or historical data to determine the correction.

In some embodiments, the artificial intelligence module 300 may calculate an updated process recipe. The artificial intelligence module 300 use the results from the first measurement module 210, the process tool 100, and the second measurement module 220 to calculate an updated recipe. The artificial intelligence module 300 may provide at least one update recipe that it has determined will correct for the difference between the achieved results (after processing) and the desired process results.

In some embodiments, the artificial intelligence module 300 may include one or more filters (not shown for clarity) to filter the metrology data in order to remove random noise.

In some embodiments, the artificial intelligence module 300 may include an outlier filter (not shown for clarity) which can be used to remove outliers that are statically not valid and should not be considered in the mean of a wafer measurement. The outlier filter can be used to eliminate both high and low outliers from the mean. For example, a box and whisker method can be applied to the site metrology data.

One aspect of the present disclosure provides a method for controlling an etching tool, including: executing a first etching recipe on a current wafer; generating a first set of data of the current wafer by a first measurement module; analyzing the first set of data by an artificial intelligence module coupled to the first measurement module; generating, by the artificial intelligence module, a second etching recipe and applying the second etching recipe to the etching tool when the first set of data is not within a predetermined range; and executing the second etching recipe on a next wafer.

Another aspect of the present disclosure provides a method for controlling an etching tool, including: executing a first etching recipe on a current wafer; generating a first set of data of the current wafer by a first measurement module; analyzing the first set of data by an artificial intelligence module coupled to the first measurement module; and executing the first etching recipe on a next wafer when the first set of data is within a predetermined range.

Another aspect of the present disclosure provides a method for controlling an etching tool, including: executing an etching recipe on a current wafer, wherein the etching recipe includes at least a first stage and a second stage; generating a first set of data of the current wafer by monitoring the first stage of the etching recipe using a first measurement module; analyzing the first set of data by an artificial intelligence module coupled to the first measurement module; and adjusting, by the artificial intelligence module, the second stage of the etching recipe when the first set of data is not within a predetermined range. The second stage of the etching process is executed after the first stage of the etching recipe.

Another aspect of the present disclosure provides a method for controlling an etching tool, including: executing an etching recipe on a current wafer, wherein the etching recipe includes at least a first stage and a second stage; generating a first set of data of the current wafer by monitoring the first stage of the etching recipe using a first measurement module; analyzing the first set of data by an artificial intelligence module coupled to the first measurement module; and executing the second stage of the etching recipe when the first set of data is within a predetermined range.

Another aspect of the present disclosure provides a method for controlling a deposition tool, including: executing a first deposition recipe on a current wafer; generating a first set of data of the current wafer by a first measurement module; analyzing the first set of data by an artificial intelligence module coupled to the first measurement module; generating, by the artificial intelligence module, a second deposition recipe and applying the second deposition recipe to the deposition tool when the first set of data is not within a predetermined range; and executing the second deposition recipe on a next wafer.

Another aspect of the present disclosure provides a method for controlling a deposition tool, including: executing a first deposition recipe on a current wafer; generating a first set of data of the current wafer by a first measurement module; analyzing the first set of data by an artificial intelligence module coupled to the first measurement module; executing the first deposition recipe on a next wafer when the first set of data is within a predetermined range.

Another aspect of the present disclosure provides a method for controlling an implantation tool, including: executing a first implantation recipe on a current wafer; generating a first set of data of the current wafer by a first measurement module; analyzing the first set of data by an artificial intelligence module coupled to the first measurement module; generating, by the artificial intelligence module, a second implantation recipe and applying the second implantation recipe to the implantation tool when the first set of data is not within a predetermined range; and executing the second implantation recipe on a next wafer.

Another aspect of the present disclosure provides a method for controlling an implantation tool, including:

executing a first implantation recipe on a current wafer; generating a first set of data of the current wafer by a first measurement module; analyzing the first set of data by an artificial intelligence module coupled to the first measurement module; and executing the first implantation recipe on a next wafer when the first set of data is within a predetermined range.

Due to the design of the method for controlling the process tool of the present disclosure, the related process recipe may be updated (or adjusted) on a wafer-to-wafer time frame by employing the artificial intelligence module 300 and the feedback data measured by the first measurement module 210. As a result, the yield and/or reliability of the wafers may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for controlling a deposition tool, comprising:
executing a first deposition recipe on a current wafer;
generating a first set of data of the current wafer by a first measurement module, wherein the first set of data is one of a data of critical dimension of the current wafer, a data of film thickness of the current wafer, and an electrical data collected by the first measurement module;
analyzing the first set of data by an artificial intelligence module coupled to the first measurement module, wherein the artificial intelligence module uses at least one of a table-based control and a formula-based control to analyze the first set of data;
generating, by the artificial intelligence module, a second deposition recipe and applying the second deposition recipe to the deposition tool when the first set of data is not within a predetermined range, wherein the artificial intelligence module updates the first deposition recipe according to a feedback data to provide the second deposition recipe for a next wafer, wherein the feedback data is one of a feedback CD data, a feedback film thickness data, and a feedback electrical data; and
executing the second deposition recipe on the next wafer, wherein a wafer-to-wafer time frame is updated and adjusted in response to the second deposition recipe.

2. The method for controlling the deposition tool of claim 1, wherein the artificial intelligence module is integrated in the deposition tool, such that a graphic user interface (GUI) and a database are shared therebetween.

3. The method for controlling the deposition tool of claim 2, wherein the artificial intelligence module comprises algorithms comprising one or more of the following, alone or in combination: machine learning, hidden Markov models; recurrent neural networks; convolutional neural networks; Bayesian symbolic methods; general adversarial networks; or support vector machines.

4. The method for controlling the deposition tool of claim 3, further comprising;
transferring the current wafer to a second measurement module before the deposition tool; and
feeding forward at least one parameter of the deposition tool to the artificial intelligence module from the second measurement module before executing the first deposition recipe on the current wafer.

5. A method for controlling a deposition tool, comprising:
executing a first deposition recipe on a current wafer;
generating a first set of data of the current wafer by a first measurement module, wherein the first set of data is one of a data of critical dimension of the current wafer, a data of film thickness of the current wafer, and an electrical data collected by the first measurement module;
analyzing the first set of data by an artificial intelligence module coupled to the first measurement module, wherein the artificial intelligence module uses at least one of a table-based control and a formula-based control to analyze the first set of data;
executing the first deposition recipe on a next wafer when the first set of data is within a predetermined range;
transferring the current wafer to a second measurement module before the deposition tool; and
feeding forward at least one parameter of the deposition tool to the artificial intelligence module from the second measurement module before executing the first deposition recipe on the current wafer;
wherein the artificial intelligence module is integrated in the deposition tool, such that a graphic user interface (GUI) and a database are shared therebetween;
wherein the artificial intelligence module comprises algorithms comprising one or more of the following, alone or in combination: machine learning, hidden Markov models; recurrent neural networks; convolutional neural networks; Bayesian symbolic methods; general adversarial networks; or support vector machines.

6. A method for controlling a deposition tool, comprising:
executing a first deposition recipe on a current wafer;
generating a first set of data of the current wafer by a first measurement module, wherein the first set of data is one of a data of critical dimension of the current wafer, a data of film thickness of the current wafer, and an electrical data collected by the first measurement module;
analyzing the first set of data by an artificial intelligence module coupled to the first measurement module, wherein the artificial intelligence module uses at least one of a table-based control and a formula-based control to analyze the first set of data;
generating, by the artificial intelligence module taking into consideration at least one of the first deposition recipe, an etching recipe, or an implanting recipe, a second deposition recipe and applying the second deposition recipe to the deposition tool when the first set of data is not within a predetermined range, wherein the artificial intelligence module updates the first deposition recipe according to a feedback data to provide the second deposition recipe for a next wafer, wherein the feedback data is one of a feedback CD data, a feedback film thickness data, and a feedback electrical data; and executing the second deposition recipe on the next wafer, wherein a wafer-to-wafer time frame is updated and adjusted in response to the second deposition recipe.

7. The method for controlling the deposition tool of claim 6, wherein the artificial intelligence module is integrated in the deposition tool, such that a graphic user interface (GUI) and a database are shared therebetween.

8. The method for controlling the deposition tool of claim 7, wherein the artificial intelligence module comprises algorithms comprising one or more of the following, alone or in combination: machine learning, hidden Markov models; recurrent neural networks; convolutional neural networks; Bayesian symbolic methods; general adversarial networks; or support vector machines.

9. The method for controlling the deposition tool of claim 8, further comprising;
    transferring the current wafer to a second measurement module before the deposition tool; and
    feeding forward at least one parameter of the deposition tool to the artificial intelligence module from the second measurement module before executing the first deposition recipe on the current wafer.

* * * * *